United States Patent [19]
Onda et al.

[11] Patent Number: 5,453,631
[45] Date of Patent: Sep. 26, 1995

[54] FIELD EFFECT TRANSISTOR HAVING A MULTI-LAYER CHANNEL

[75] Inventors: Kazuhiko Onda; Kenichi Maruhashi; Masaaki Kuzuhara, all of Tokyo, Japan

[73] Assignee: NEC Corporation, Tokyo, Japan

[21] Appl. No.: 56,540

[22] Filed: May 5, 1993

[30] Foreign Application Priority Data

May 6, 1992 [JP] Japan .................................. 4-113283
May 15, 1992 [JP] Japan .................................. 4-122460

[51] Int. Cl.$^6$ ...................... H01L 29/804; H01L 29/812
[52] U.S. Cl. .......................................... 257/192; 257/194
[58] Field of Search .................................. 257/192, 194, 257/195, 20, 25, 27

[56] References Cited

FOREIGN PATENT DOCUMENTS

| 0196057 | 11/1983 | Japan | 257/194 |
|---|---|---|---|
| 0368143 | 3/1991 | Japan | 257/194 |
| 4245647 | 9/1992 | Japan | 257/192 |

OTHER PUBLICATIONS

G. I. Ng et al., "Improved strained . . . Double hetero function $In_{0.65}Ga_{0.35}As/In_{0.52}Al_{0.48}As$ Design"; IEEE Microwave and Guided Wave Letters, vol. 1, No. 5, Mar. 1989, pp. 114–116.

"Low–Temperature DC characteristics of Pseudomorphic $Ga_{0.8}In_{0.82}P/InP/Ga_{0.47}In_{0.53}As$ HEMT"; Lovaliche et al. IEEE electron device letters, vol. 11, No. 4, Apr. 1990.

Martin et al; "Highly Stable Microwave Performance InP/InGaAs HIGFET's"; IEEE vol. 37 No. 8; Aug. 1990 pp. 1916–1917.

K. H. G. Duh et al., "A Super Low–Noise 0.1 μm T–Gate InAlAs–InGaAs–InP HEMT", IEEE Microwve and Guided Wave Letters, vol. 1, No. 5, May 1991, pp. 114–116.

G. I. Ng et al., "Improved Strained . . . Double–Heterojunction $In_{0.65}Ga_{0.35}As/In_{0.52}Al_{0.48}As$ Design", IEEE Electron Device Letters, vol. 10, No. 3, Mar. 1989, pp. 114–116.

Tatsushi Akazaki et al., "Improved InAlAs/InGaAs HEMT . . . InAs Layer into the InGaAs Channel", IEEE Electron Device Letters, vol. 13, No. 6, Jun. 1992, pp. 325–327.

*Primary Examiner*—Robert P. Limanek
*Assistant Examiner*—Wael M. Fahmy
*Attorney, Agent, or Firm*—Sughrue, Mion, Zinn, Macpeak & Seas

[57] ABSTRACT

In a field effect transistor having a channel layer interposed between heterojunctions, the channel layer has an intermediate layer of undoped InGaAs interposed between first and second channel layers each of which has a composition different from the intermediate layer. The composition of each of the first and the second channel layers may be composed of either InP or InGaAs. The intermediate layer may be formed either by a single layer of InGaAs or by a plurality of intermediate films of InGaAs which have In compositions different from one another when each of the first and the second channel layers is composed of InP. A maximum one of the In compositions is assigned to a selected one of the intermediate films. Alternatively, a selected one of the intermediate films includes a maximum In composition when each of the first and the second channel layers is formed by InGaAs.

12 Claims, 18 Drawing Sheets

FIELD EFFECT TRANSISTOR HAVING A MULTI-LAYER CHANNEL

BACKGROUND OF THE INVENTION

This invention relates to a field effect transistor which is operable in a millimeter wave band and which is formed by the use of a compound semiconductor.

In general, it is well known in the art that a semiconductor device formed by silicon can not be operated in such a millimeter wave band. Taking this into consideration, a wide variety of compound semiconductor devices have been proposed in order to enable operation in the millimeter wave band. Among others, recent attention has been directed to a field effect transistor which has a channel formed by a two-dimensional electron gas (2-DEG) developed in a heterojunction structure.

As a rule, a conventional semiconductor device, such as a field effect transistor of a heterojunction structure type, is often implemented by a ternary or a quarternary compound semiconductor, such as InGaAs, InGaAsP. Such a conventional semiconductor device is described by K. H. G. Duh et al in IEEE MICROWAVE AND GUIDED WAVE LETTERS, VOL. 1, NO. 5, (May, 1991) and is entitled "A Super Low-Noise 0.1 µm T-Gate InAlAs-InGaAs-InP HEMT". More specifically, the conventional semiconductor device disclosed above is specified by a sandwiched structure which comprises a semi-insulator substrate of InP, a buffer layer formed by undoped or intrinsic InAlAs on the semi-insulator substrate, a channel layer of undoped InGaAs, a spacer layer formed by undoped InAlAs, a carrier supply layer of InAlAs doped with an n-type impurity, a Schottky layer of undoped InAlAs, and an InGaAs cap layer doped with an n-type impurity. A gate electrode is attached to the Schottky layer while source and drain electrodes are formed on the cap layer. With this structure, the gate electrode is located between the source and the drain electrodes.

With this structure, the channel layer of the undoped InGaAs is interposed between the buffer layer of the undoped InAlAs and the spacer layer of the undoped InAlAs. At any rate, the above-mentioned heterostructure serves to enhance a two-dimensional electron gas density and to reduce series resistance and increase current density. Practically, the field effect transistor achieves a noise figure of 1.2 dB and a gain of 7 dB at a frequency of 94 GHz.

Alternatively, another conventional semiconductor device is also disclosed by G. I. NG in IEEE ELECTRON DEVICE LETTERS, VOL. 10, NO. 3, Page 114 (March, 1989) and entitled "Improved Strained HEMT Characteristics Using Double-Heterojunction $In_{0.65}Ga_{0.35}As/In_{0.52}Al_{0.48}As$ Design". The semiconductor device disclosed by NG et al comprises a channel layer of InGaAs which includes an amount of In greater than 0.53 relative to an amount of Ga in order to improve a device characteristic in comparison with the device disclosed by Duh et al. However, it is to be noted that a thickness of the channel layer is limited by an amount of In included in the channel layer because a lattice-mismatch takes place between the semi-insulator substrate of InP and the channel layer of InGaAs when an amount of In exceeds 0.53. As a result, a breakdown voltage is unfavorably reduced in the semiconductor device disclosed by NG.

Furthermore, disclosure is also made by T. Akazaki et al in IEEE ELECTRON DEVICE LETTERS, VOL. 13, NO. 6, Pages 325–327, (June 1992), about another conventional device that comprises a channel layer of InGaAs in which a thin InAs film is inserted.

Thus, each of the conventional devices mentioned above has the channel layer of InGaAs in common.

Herein, it is noted that an effective mass of electrons running or flowing in the channel layer of InGaAs becomes light or small as an amount of In increases in the channel layer. This means that a drift velocity of the electrons becomes fast as the effective mass of the electrons becomes small.

It has been kept in mind that the amount of In in the channel layer is equal to 0.53 so as to lattice match the channel layer with the substrate of InP. However, even when an amount of In exceeds 0.53, it is possible to obtain an excellent crystal with a strain applied to the crystal, if a thickness of the channel layer is selected so that any misfit dislocation does not occur.

As mentioned above, it is effective to increase an amount of In within a range such that no misfit dislocation takes place, so as to reduce the effective mass of channel electrons.

Practically, a critical thickness of the channel layer of InGaAs necessary for preventing the misfit dislocation becomes thin with an increase of an amount of In. This makes it difficult to obtain an enough sheet carrier density.

Moreover, a bandgap in the channel layer becomes narrow as an amount of In increases, which unfavorably increases a probability of impact ionization under a high electric field and makes a high speed operation difficult. Accordingly, an increase of In is not preferable when the semiconductor device is operated under the high electric field.

In addition, a structure which has the InAs layer inserted in the channel layer, as proposed by Akazaki et al, is liable to give rise to impact ionization when a high electric field is impressed. This is because electrons are rendered into hot electrons in the InAs layer on impression of the high electric field. Such impact ionization brings about an undesirable increase of a drain conductance and so on and results in deterioration of device performance.

At any rate, it is difficult to stably form a two-dimensional electron gas channel without a misfit dislocation when the channel layer of InGaAs is used in the above-mentioned manners.

Moreover, although the electrons in the channel layer of InGaAs can accomplish a high velocity operation within a low electric field in comparison with electrons included in a channel layer of GaAs, the former can not accomplish a high velocity operation within a high electric field which is higher than about 10 kV/cm because the electrons in the channel layer of InGaAs moves at a drift velocity which is not greatly changed from a drift velocity of the electrons in the GaAs layer. Eventually, use of the channel layer of InGaAs can not assure the high velocity operation within the high electric field as compared with use of the channel layer of GaAs. This makes use of the InGaAs meaningless because the greatest merit of using the InGaAs resides in improvement of the channel electron velocity.

SUMMARY OF THE INVENTION

It is an object of this invention to provide a field effect transistor which is capable of forming a quantum well without a misfit dislocation.

It is another object of this invention to provide a field effect transistor of the type described, which is capable of improving a channel electron density and, thereby, improving an average drift velocity of a whole of electrons which are running in a channel layer.

It is still another object of this invention to provide a field effect transistor of the type described, which is capable of equivalently increasing a density of In in the channel layer.

It is yet another object of this invention to provide a field effect transistor of the type described, which can accomplish a high drift velocity under a high electric field.

It is another object of this invention to provide a field effect transistor of the type described, which is capable of achieving a high drift velocity even under a low electric field in comparison with conventional devices as mentioned above.

A field effect transistor to which this invention is applicable comprises a semi-insulator substrate of InP, a buffer layer on the semi-insulator substrate, a non-doped channel layer on the buffer layer, and a carrier supply layer which is doped with an n-type impurity and which is deposited on the non-doped channel layer.

According to a first aspect of this invention, the non-doped channel layer comprises a first layer of InP on the buffer layer, an intermediate layer of InGaAs on the first layer, and a second layer of InP on the intermediate layer. The intermediate layer is composed of either a single layer of InGaAs or a plurality of intermediate films each of which consists of InGaAs and which is different from one another in an In composition.

According to another aspect of this invention, the non-doped channel layer comprises a first layer which is deposited on the buffer layer and which consists of a composition represented by $In_{x1}Ga_{1-x1}As$, an intermediate layer of InGaAs which is deposited on the first layer and which has a composition different from the first layer, and a second layer which is deposited on the intermediate layer and which consists of a composition represented by $In_{x2}Ga_{1-x2}As$ and different from the intermediate layer. The intermediate layer may be composed of a single layer of InGaAs or a plurality of intermediate films each of which consists of InGaAs and which is different from one another in an In composition.

DESCRIPTION OF THE PREFERRED EMBODIMENTS

Figure 1:
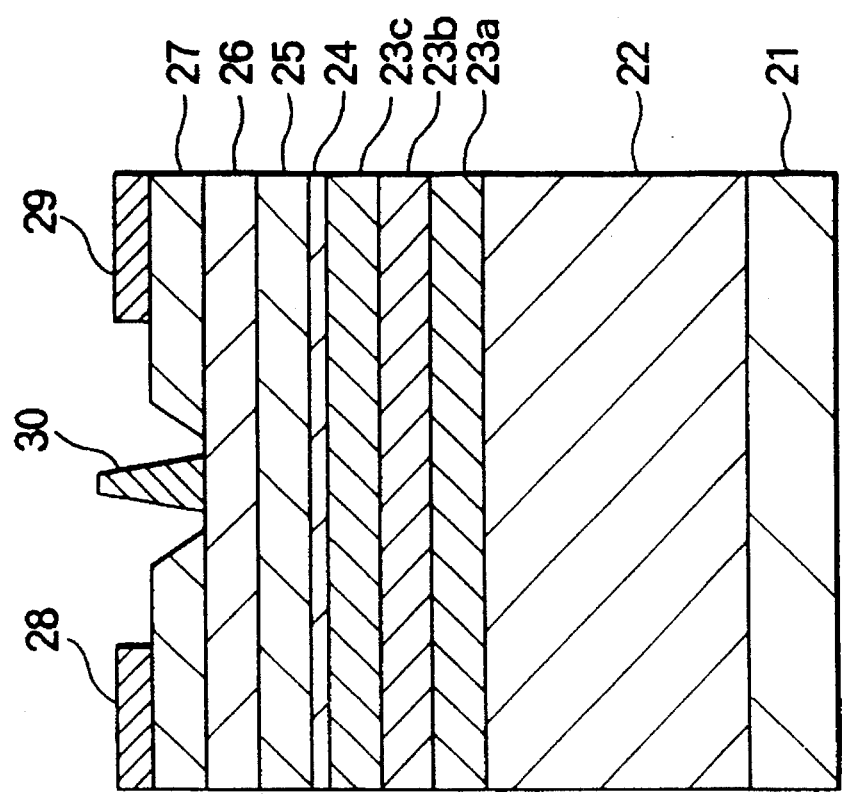
FIG. 1 is a sectional view of a field effect transistor according to a first embodiment of this invention.

Referring to FIG. 1, a field effect transistor according to a first embodiment of this invention comprises a semi-insulator substrate 21 of InP having a principal surface directed upwards of FIG. 1 and a buffer layer 22 of an undoped or intrinsic InAlAs which is deposited on the principal surface to a thickness of 800 nm and which comprises a composition represented by $In_{0.52}Al_{0.48}As$. In this connection, the buffer layer 22 may be called an i-$In_{0.52}Al_{0.48}As$ layer. On the buffer layer 22, a channel layer 23 is deposited to a thickness of 15 nm and has a structure which will later be described in detail.

After deposition of the channel layer 23, a spacer layer 24 of an intrinsic $In_{0.52}Al_{0.48}As$ is deposited to a thickness of 3 nm on the channel layer 23. Thereafter, a carrier supply layer 25, a Schottky layer 26, and a cap layer 27 are successively deposited on the spacer layer 24 to thicknesses of 30 nm, 20 nm, and 30 nm, respectively. Herein, the carrier supply layer 25 serves to supply electrons to the channel layer 23 and comprises a composition represented by $In_{0.52}Al_{0.48}As$ which is doped with an n-type impurity of, for example, silicon in a density of $2\times10^{18}$ cm$^{-3}$ and which is depicted at n-$In_{0.52}Al_{0.48}As$ while the Schottky layer 26 is formed by an intrinsic $In_{0.52}Al_{0.48}As$. The illustrated cap layer 27 is composed of $In_{0.53}Ga_{0.47}As$ doped with an n-type impurity, namely, silicon in a density of $5\times10^{18}$ cm$^{-3}$.

The above-mentioned buffer layer 22, the channel layer 23, the spacer layer 24, the carrier supply layer 25, the Schottky layer 26, and the cap layer 27 are successively deposited by metal organic chemical vapor deposition (MOCVD).

In FIG. 1, the channel layer 23 is composed of a first channel layer 23a of intrinsic InP, namely, i-InP deposited to a thickness of 5 nm on the buffer layer 22, an intermediate channel layer 23b of i-In$_x$Ga$_{1-x}$As deposited to a thickness of 5 nm on the first channel layer 23a, and a second channel layer 23c deposited to a thickness of 5 nm on the intermediate channel layer 23b and brought into contact with the spacer layer 24. All of the first, the intermediate, and the second channel layers 23a, 23b, and 23c are successively grown up by the use of MOCVD.

Subsequently, the cap layer 27 is partially etched to the Schottky layer 26 to form a recessed portion on the cap layer 27. Under the circumstances, source and drain electrodes 28 and 29 are mounted as ohmic electrodes on the cap layer 27 by evaporation of AuGe and Ni and by heating them while a Schottky gate electrode 30 of Ti, Pt, and Au is mounted on the recessed portion.

Specifically, in the illustrated intermediate channel layer 23b, an In composition or an In mole fraction x is selected at 0.53. In this connection, the intermediate channel layer 23b comprises a composition represented by In$_{0.53}$Ga$_{0.47}$As. Thus, the InGaAs channel layer, namely, the intermediate channel layer 23b is sandwiched between the InP channel layers, namely, the first and the second channel layers 23a and 23c with boundary faces intervening between the first channel layer 23a and the intermediate layer 23b and between the second channel layer 23c and the intermediate channel layer 23b.

With this channel layer 23, a quantum well is formed across the first and the second channel layers 23a and 23c and the intermediate channel layer 23b, namely, across the three layers. Consequently, a two-dimensional electron gas is mainly developed within the quantum well and has a distribution of electrons across the three channel layers 23a, 23b, and 23c. Thus, the two-dimensional electron gas is operable as a channel.

Herein, let a characteristic of the above-mentioned channel structure be considered for a better understanding of this invention. At first, an electron distribution has a distribution center of the electrons in the intermediate channel layer 23b while an amount of the electrons is gradually reduced as it is near to the boundary faces. This shows that the electrons mainly flow or run through the intermediate channel layer 23b at a high drift velocity determined by the amount of In, even when a low electric field is impressed.

In addition, the amount of In included in the intermediate channel layer 23b is set at 0.53 in the illustrated example so that the intermediate channel layer 23b is lattice matched with the first and the second channel layers 23a and 23c. However, the amount of In may be increased within a range wherein a misfit dislocation is not caused to occur between the intermediate and the first channel layers 23b and 23a and between the intermediate and the second channel layers 23b and 23c. In this case, a strained channel layer may be formed by the above-mentioned three channel layers. To the contrary, the amount of In may be smaller than 0.53.

According to the inventor's experimental studies, an amount of In in the intermediate channel layer 23b of InGaAs may be greater than 0.4 and is not greater than unity. Herein, the amount of In in the InGaAs channel layer will be defined as an In composition or mole fraction which represents a ratio of In relative to Ga. Taking this into consideration, it is understood that the In composition may be equal to unity. In other words, the intermediate channel layer 23b may be composed of InAs.

Figure 2:
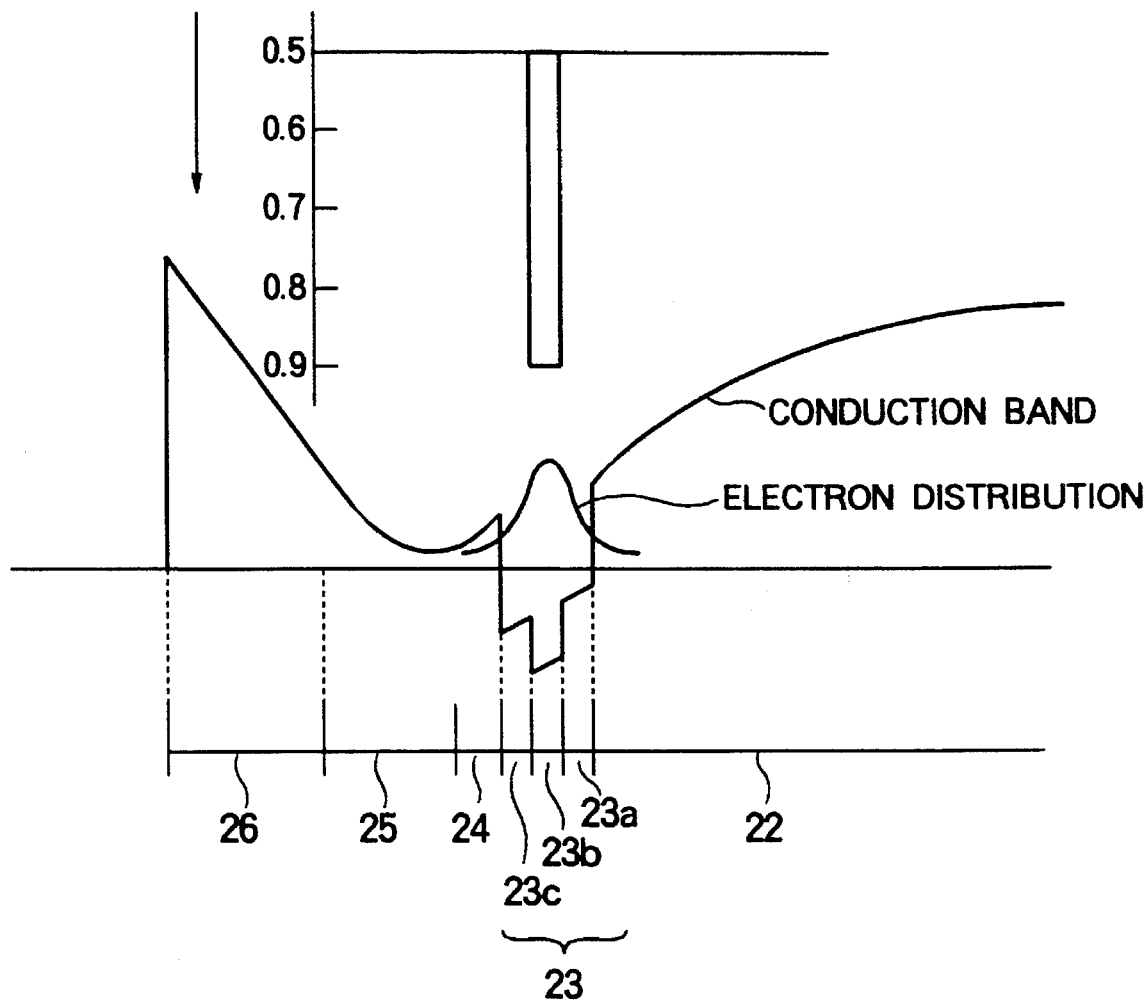
FIG. 2 is a view for use in describing an In composition of a channel layer illustrated in FIG. 1, together with an electron distribution and a conduction band.

Referring to FIG. 2, a field effect transistor according to a modification of the first embodiment is similar in structure to that illustrated with reference to FIG. 1 except that the In composition in the intermediate channel layer 23b is increased to 0.9. In FIG. 2, the In composition is illustrated in an upper part of FIG. 2 and is equal to 0.9, as mentioned above. In addition, an energy band diagram of a conduction band and an electron distribution are shown in relation to the layers, such as 22, 23a, 23b, 23c, 24, 25, and 26 illustrated in FIG. 1.

With this structure, a quantum well is formed in the channel layer 23 and is deeper in the intermediate channel layer 23b than the first and the second layers 23a and 23c. The electron distribution has a distribution center in the intermediate channel layer 23b. In this connection, most of electrons are confined within the intermediate channel layer 23b.

Figure 3:
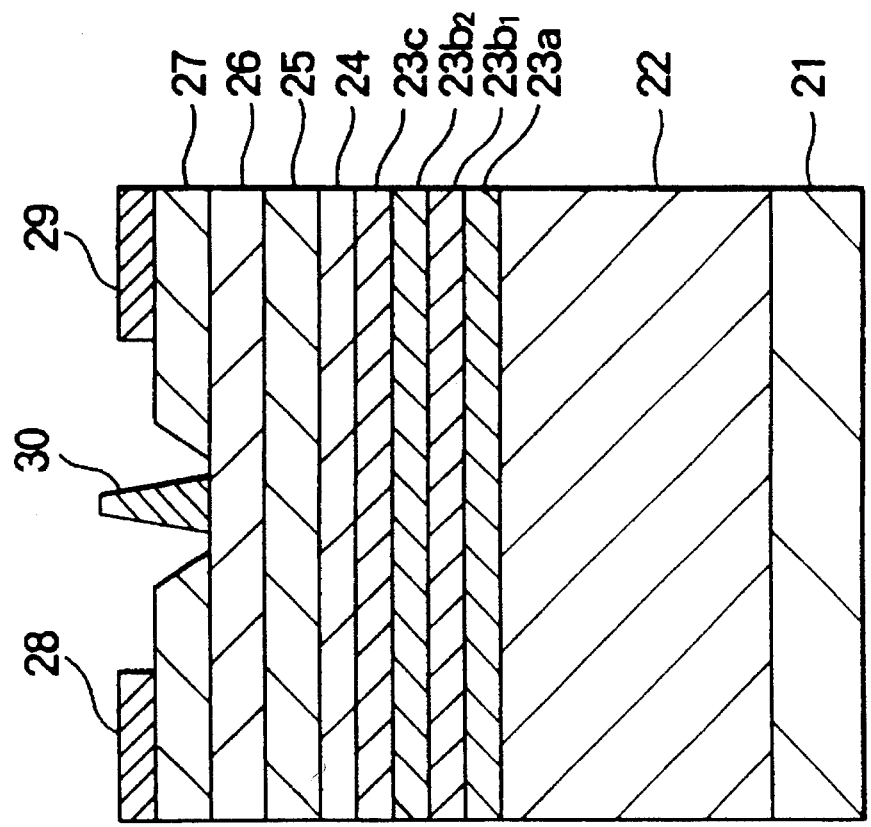
FIG. 3 is a sectional view of a field effect transistor according to a second embodiment of this invention.

Referring to FIG. 3, a field effect transistor according to a second embodiment of this invention is similar to that illustrated in FIG. 1 except that the field effect transistor of FIG. 3 comprises a channel layer 23 which is somewhat different from that illustrated in FIG. 1. More specifically, the channel layer 23 illustrated in FIG. 3 is composed of a four-layer or four-film structure and comprises a first channel layer 23a of intrinsic InP deposited to a thickness of 3 nm on the buffer layer 22, a second channel layer 23c of intrinsic InP which is brought into contact with the spacer layer 24 and which has a thickness of 3 nm, and an intermediate channel layer 23b interposed between the first and the second channel layers 23a and 23c.

The illustrated intermediate channel layer 23b is formed by an intrinsic InGaAs and is composed of a first intermediate film 23b1 deposited to a thickness of 5 nm on the first channel layer 23a and a second intermediate film 23b2 deposited to a thickness of 4 nm on the first intermediate film 23b1. The first and the second intermediate films 23b1 and 23b2 have undoped or intrinsic compositions specified by In$_{x1}$Ga$_{1-x1}$As and In$_{x2}$Ga$_{1-x2}$As, respectively.

In the example being illustrated, x1 and x2 which may be called In compositions, as mentioned before, are selected at 0.9 and 0.53, respectively. In this connection, the first and the second intermediate films 23b1 and 23b2 are specified by the compositions of In$_{0.9}$Ga$_{0.1}$As and In$_{0.53}$Ga$_{0.47}$As, respectively, and are deposited by the use of metal organic chemical vapor deposition (MOCVD) like the other layers, such as 22, 24, 25, 26.

The source, the drain, and the gate electrodes 28, 29, and 30 are identical with those illustrated in FIG. 1 and will not be described any longer.

With this structure, a two-dimensional electron gas is formed within a quantum well defined in the first and the second channel layers 23a and 23c and the first and the second intermediate films 23b1 and 23b2 and acts as a channel. Specifically, the two-dimensional electron gas is present in the quantum well spread over a whole of the channel layer 23 and has a distribution center in the first and the second intermediate films 23b1 and 23b2. When the In compositions in the first and the second intermediate films 23b1 and 23b2 are selected in the above-mentioned manner, a distribution center of electrons in the channel is present in the first intermediate film 23b1 because the In composition in the first intermediate film 23b1 is higher than that in the second intermediate film 23b2. Such an electron distribution is effective when an operation bias voltage of the field effect transistor is set in a region near to a pinch-off voltage.

The illustrated field effect transistor enables a high speed operation due to the In composition or density included in the channel layer 23. This results in an improvement of the device characteristic.

Figure 4:
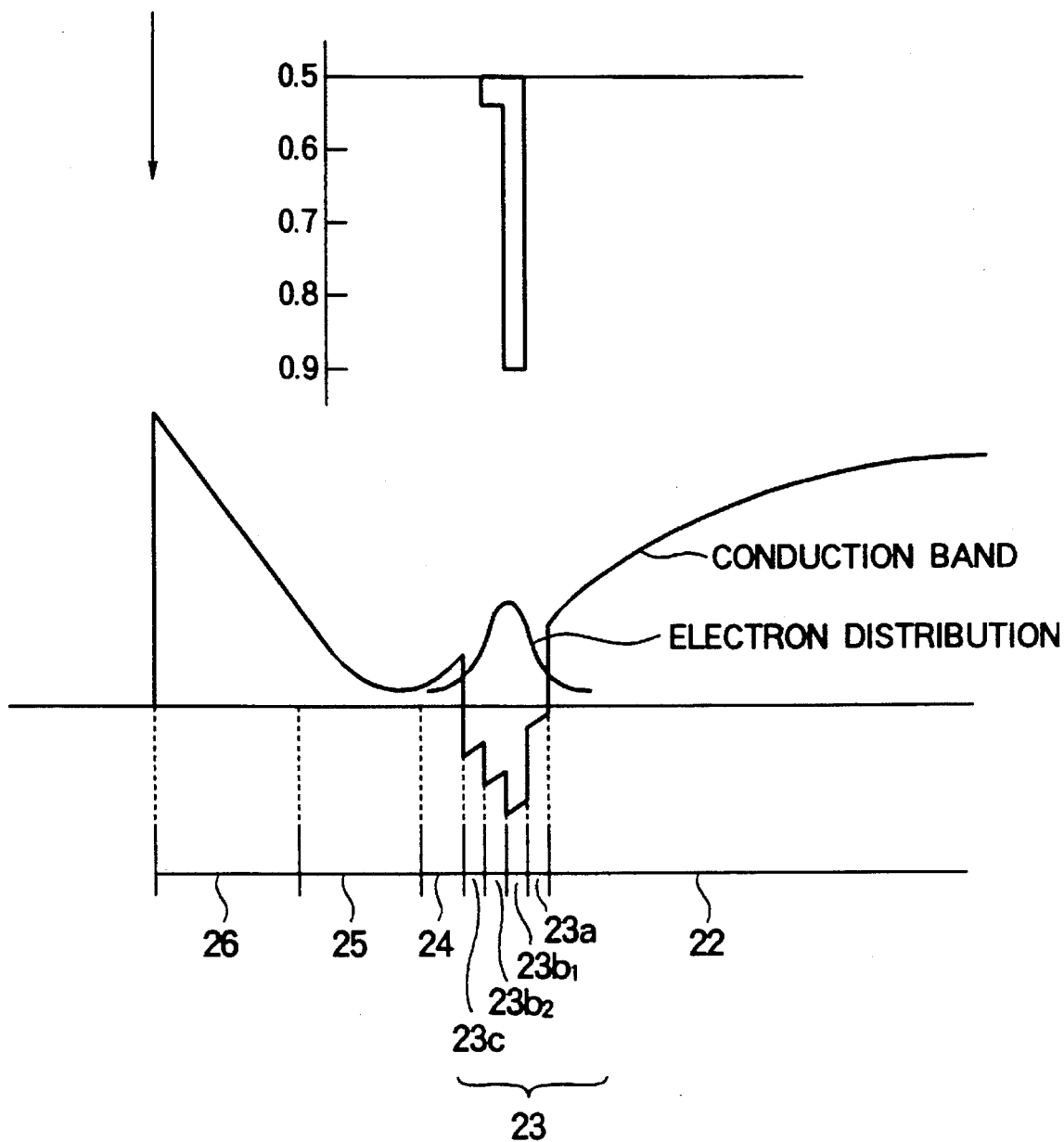
FIG. 4 is a view for use in describing a relationship among an In composition included in a channel layered illustrated in FIG. 3, an electron distribution, and a conduction band.

Referring to FIG. 4, the In compositions included in the first and the second intermediate films 23*b*1 and 23*b*2 of the field effect transistor shown in FIG. 3 are illustrated in relation to a band diagram and an electron distribution in a manner similar to that illustrated in FIG. 2. In FIG. 4, the In compositions, a conduction band, and the electron distribution are made to correspond to the layers, such as 22, 23*a*, 23*b*1, 23*b*2, 23*c*, 24, 25, and 26 illustrated in FIG. 3. As shown in FIG. 4, a quantum well is formed over a whole of the channel layer 23 and is the deepest in the first intermediate film 23*b*1. The electron distribution has a peak or maximum in the first and the second intermediate films 23*b*1 and 23*b*2 and becomes low as it is close to the buffer layer 22 and the spacer layer 24.

In the illustrated example, the In composition of the second intermediate film 23*b*2 is set to 0.53 in consideration of lattice matching while the In composition of the first intermediate film 23*b*1 is set to 0.9. However, the In compositions are not restricted to the above-mentioned values but may be modified on the conditions that the In composition x1 is higher than the In composition x2 and that no misfit dislocation takes place with a strained layer left as the channel layer 23. Specifically, the second intermediate film 23*b*2 may have the In composition which is smaller than 0.53 and which may be greater than 0.4.

It is assumed that the first and the second intermediate film 23*b*1 and 23*b*2 have strained directions reversed to each other. In this case, a strain is alleviated as a whole of the channel layer 23. Such alleviation of the strain preferably serves to increase a critical thickness of the channel layer and to thereby thicken the channel layer.

Figure 5:
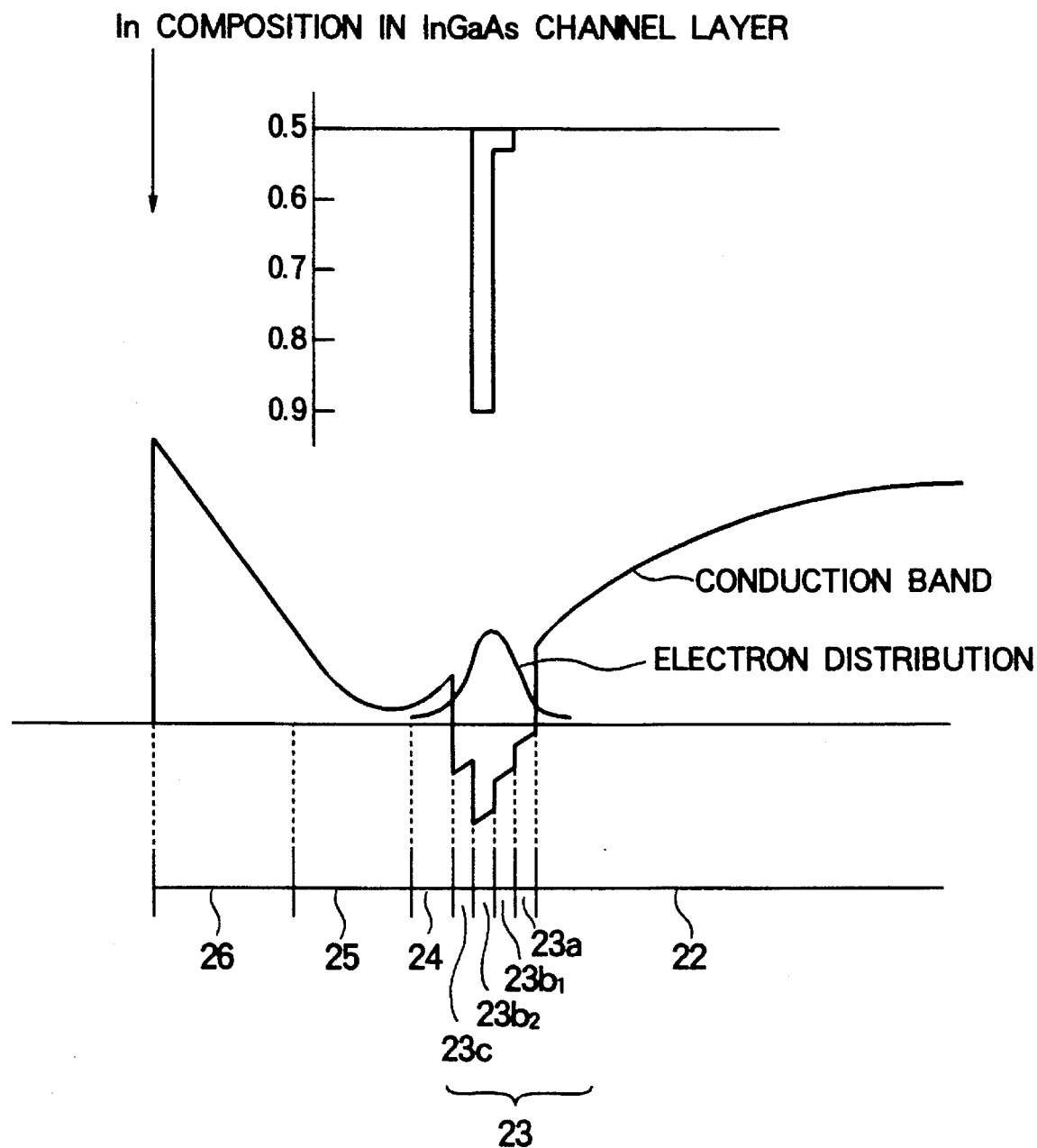
FIG. 5 is a view for use in describing a relationship among an In composition, an electron distribution, and a conduction band in a modification of the field effect transistor according to the second embodiment of this invention.

Referring to FIG. 5 afresh and FIG. 3 again, a modification of the field effect transistor according to the second embodiment of this invention is similar in structure to that illustrated in FIG. 2 except that the In compositions in the first and the second intermediate films 23*b*1 and 23*b*2 are selected at 0.53 and 0.9, respectively, as illustrated in FIG. 5. The first and the second intermediate films 23*b*1 and 23*b*2 are deposited by the use of MOCVD to 5 nm and 4 nm, respectively, like in the second embodiment.

As shown in FIG. 5, the quantum well is spread over a whole of the channel layer 23 and has the deepest depth in the second intermediate film 23*b*2 while the two-dimensional electron gas is developed in the quantum well and is operable as a channel in the manner illustrated in conjunction with FIG. 4. The electron distribution has a distribution center in the first and the second intermediate films 23*b*1 and 23*b*2 and becomes small as it is remote from the first and the second intermediate films 23*b*1 and 23*b*2. Strictly, a center of the electrons in the channel resides in the second intermediate film 23*b*2 because the In composition in the second intermediate film 23*b*2 is higher than that in the first intermediate film 23*b*1. In other words, the center of the electrons is close, in the field effect transistor according to the modification, to a device surface on which the source, the drain, and the gate electrodes 28, 29, and 30 are mounted. Such an electron distribution is preferable when an operation bias voltage is set so that the field effect transistor is operated at a comparatively large current. In addition, the field effect transistor according to this modification enables a high speed operation in dependency upon the In composition or density and has an improved characteristic.

Although the In compositions x1 and x2 are selected at 0.53 and 0.9 in the above modification, x1 and x2 may be changed on the conditions that the In composition x1 is smaller than x2 and that no misfit dislocation takes place. Moreover, the In composition in the second intermediate film 23*b*2 may be equal to unity, as mentioned in conjunction with the first embodiment.

On the other hand, the In composition in the first intermediate film 23*b*1 may be smaller than 0.53, if it is greater than 0.4. With this structure, it is possible to thicken a critical thickness of a whole of the channel layer 23, which brings about an increase of the channel layer.

Figure 6:
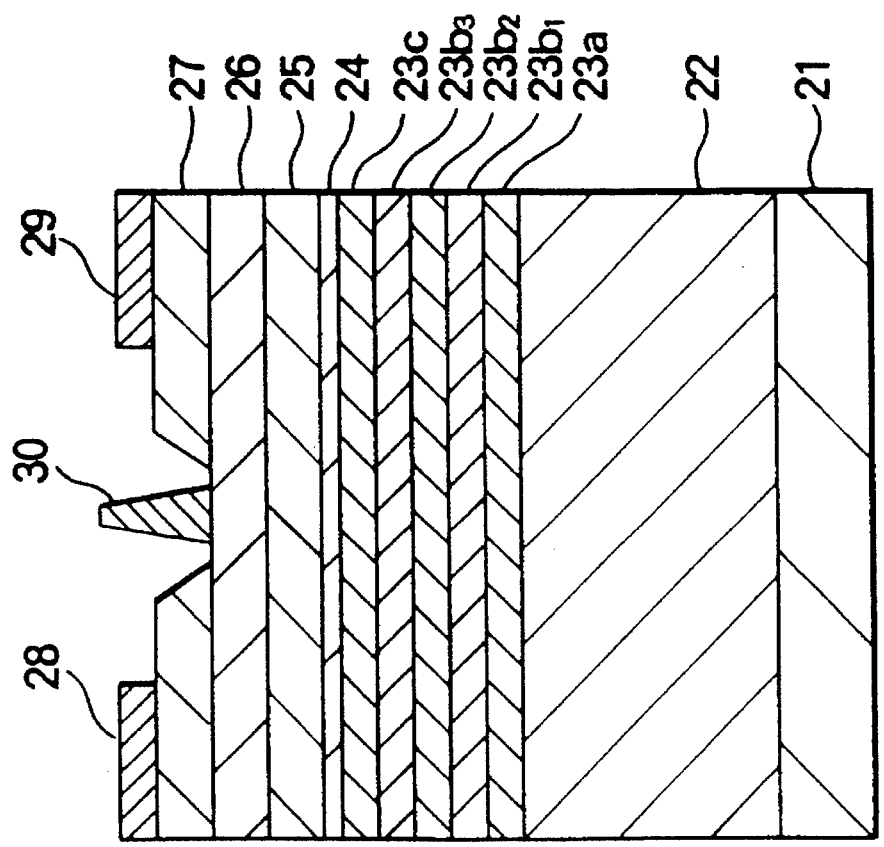
FIG. 6 is a sectional view of a field effect transistor according to a third embodiment of this invention.

Referring to FIG. 6, a field effect transistor according to a third embodiment of this invention is similar in structure to that illustrated in FIG. 3 except that a channel layer 23 has a five-layer or film structure, as shown in FIG. 6. In FIG. 6, the channel layer 23 comprises the first channel layer 23*a* deposited on the buffer layer 22, the second channel layer 23*c* brought into contact with the spacer layer 24, and the intermediate .channel layer 23*b* interposed between the first and the second layers 23*a* and 23*c*.

In the illustrated example, the intermediate channel layer 23*c* comprises a first intermediate film 23*b*1 of intrinsic $In_{x1}Ga_{1-x1}As$ on the buffer layer 22, a second intermediate film 23*b*2 of intrinsic $In_{x2}Ga_{1-x2}As$ on the first intermediate film 23*b*1, and a third intermediate film 23*b*3 of intrinsic $In_{x3}Ga_{1-x3}As$ on the second intermediate film 23*b*2. Each of the first through the third intermediate films 23*b*1 to 23*b*3 is deposited to a thickness of 3 nm by the use of MOCVD. The In compositions x1, x2, and x3 are selected at 0.9, 0.7, and 0.53 in the example. In this connection, the first through the third intermediate films 23*b*1 to 23*b*3 are composed of compositions specified by $In_{0.9}Ga_{0.1}As$, $In_{0.7}Ga_{0.3}As$, and $In_{0.53}Ga_{0.47}As$, respectively.

Figure 7:
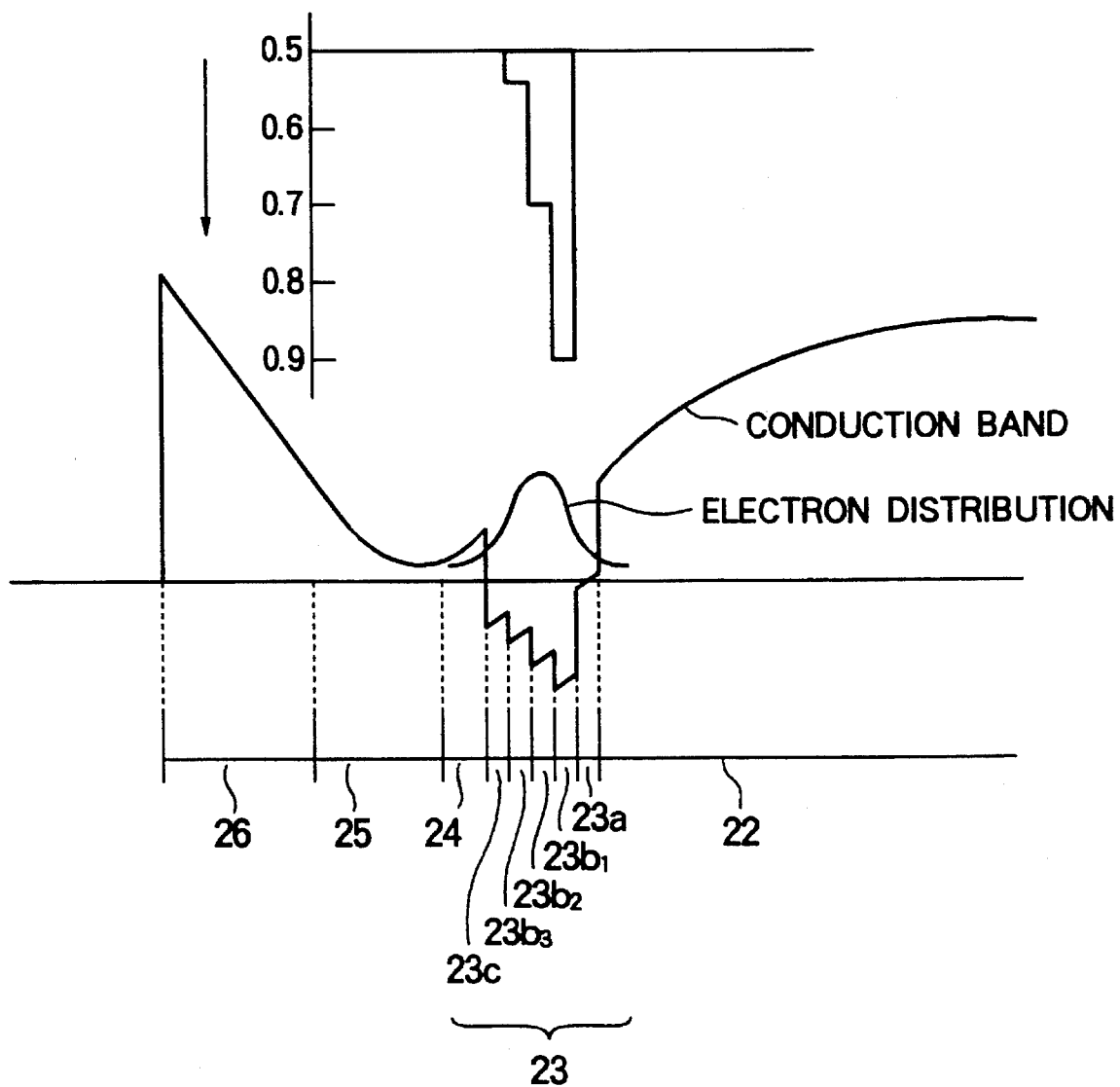
FIG. 7 is a view for use in describing a relationship among an In composition included in a channel layer, an electron distribution, and a conduction band in the field effect transistor illustrated in FIG. 6.

Referring to FIG. 7 in addition to FIG. 6, the In compositions in the first through the third intermediate films 23*b*1 to 23*b*3 are illustrated together with an electron distribution and a conduction band in the layers 22, 23*a*, 23*b*1 to 23*b*3, 23*c*, 24, 25, and 26, like in FIGS. 2, 4, and 5. As already mentioned in conjunction with FIGS. 2, 4, and 5, a two-dimensional electron gas is developed within a quantum well spread over a whole of the channel layer 23 and is operable as a channel. In the illustrated example, the quantum well is the deepest in the first intermediate film 23*b*1, as readily understood from FIG. 7.

With this structure, a center of an electron distribution is present in the vicinity of the first intermediate film 23*b*1 because the first intermediate film 23*b*1 has a maximum In composition. Inasmuch as the first intermediate film 23*b*1 is remote from the device surface, this structure is effectively operable when the operation bias voltage is set to a voltage close to a pinch-off voltage determined for a drain current. A high speed operation is also accomplished due to a high In density.

In the above example, although the In compositions x1, x2, and x3 are set to 0.9, 0,7, and 0.53, respectively, they are modified on the conditions that x1 is greater than x2 and x3 and that no misfit dislocation takes place with a strained layer left. On the other hand, x2 and x3 may be smaller than 0.53. With this structure, it is possible to increase a critical thickness and a whole of a channel thickness.

Figure 8:
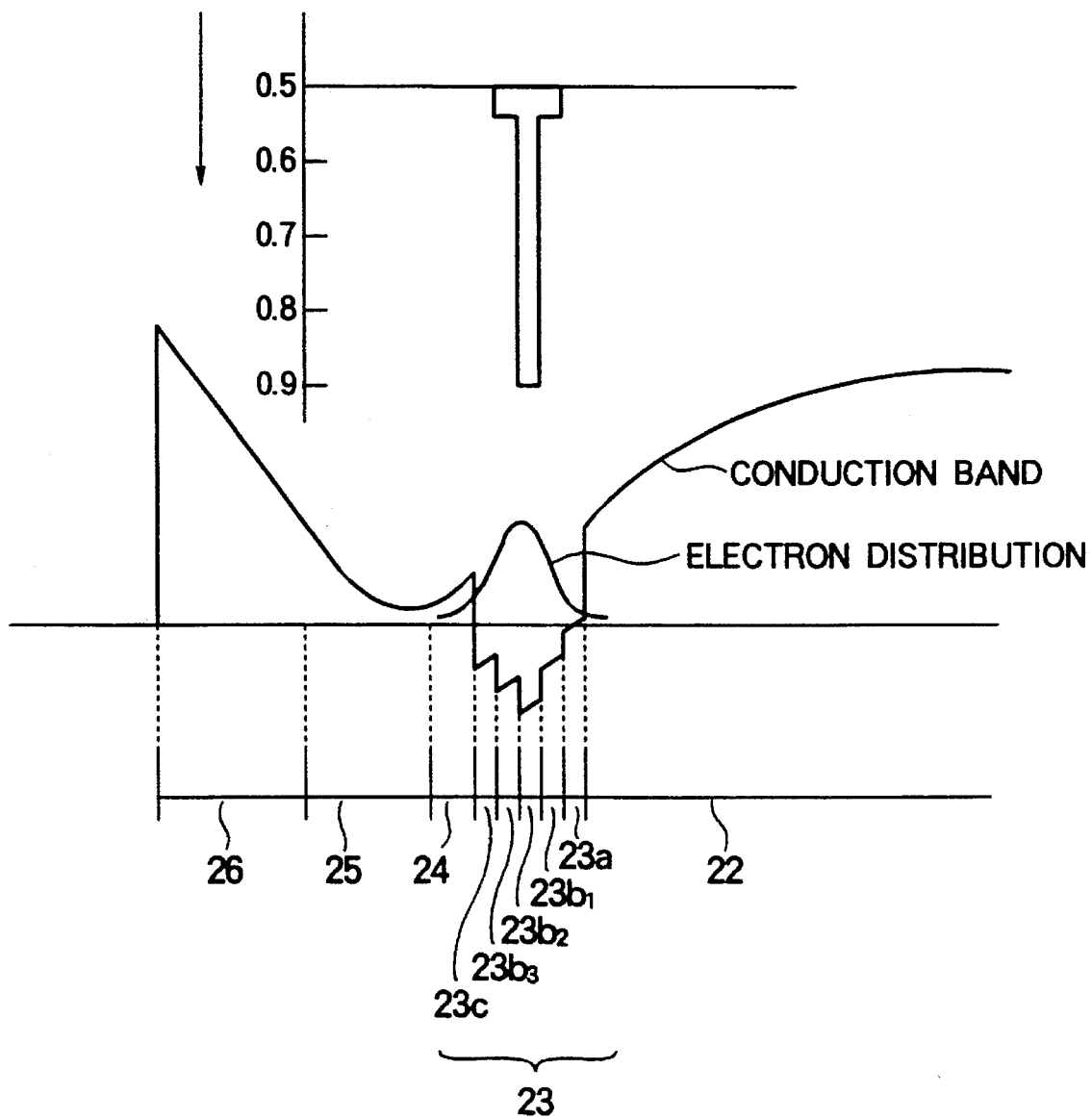
FIG. 8 is a view for use in describing a field effect transistor according to a fourth embodiment of this invention.

Referring to FIG. 8, a field effect transistor according to a fourth embodiment of this invention is similar in structure to that illustrated in FIG. 6 except that the first through the third intermediate films 23*b*1, 23*b*2, and 23*b*3 comprise compositions specified by $In_{0.53}Ga_{0.47}As$, $In_{0.9}Ga_{0.1}As$, and $In_{0.53}Ga_{0.47}As$, respectively, as illustrated in FIG. 8. Thus, the first intermediate film 23b1 comprises the same composition as the third intermediate film 23b3. In other words, the In compositions x1, x2, and x3 are set to 0.53, 0.9, and 0.53, respectively.

As shown in FIG. 8, a quantum well is formed across all of the first channel layer 23a, the first through the third intermediate films 23b1, 23b2, and 23b3, and the second channel layer 23c and provides an electron distribution which has a distribution center in a portion adjacent to the second intermediate film 23b2, as illustrated in FIG. 8. Such an electron distribution is very effective when the field effect transistor is given a large operation bias voltage. In addition, a high In density of 0.9 of the second intermediate film 23b2 enables a high speed operation of the field effect transistor and an improvement of a device characteristic.

The In compositions of the first through the third intermediate films 23b1 to 23b3 may be changed to any other values on the conditions that x2 is greater than x1 and x3 and that no misfit dislocation takes place, like in the other embodiments. In this case, x1 and x3 may be smaller than 0.53 and greater than 0.4. On the other hand, x2 may be equal to unity to form the second intermediate film 23b2 by an intrinsic InAs film. At any rate, a critical channel layer becomes thick, as described in conjunction with the aforementioned embodiments.

Figure 9:
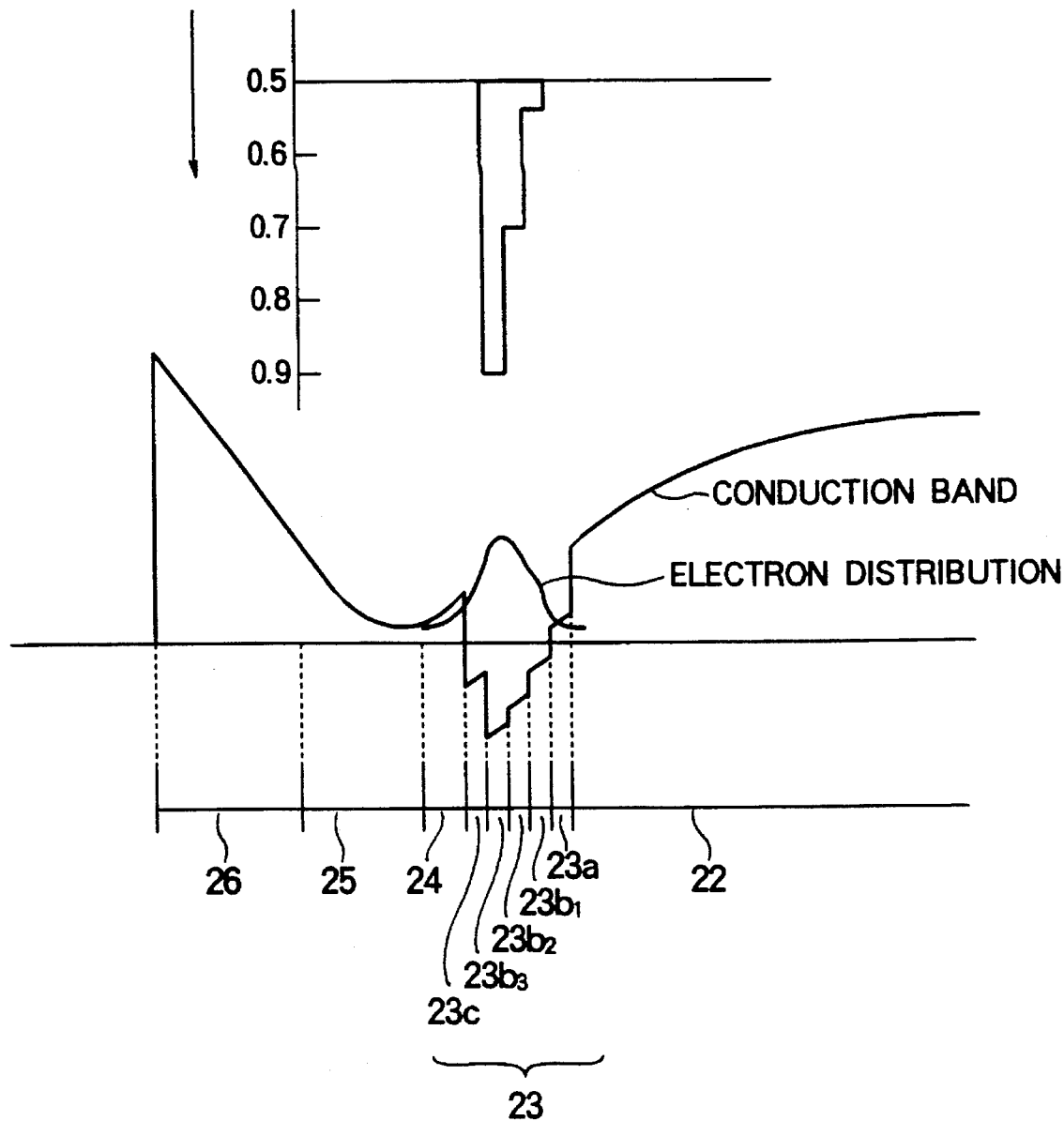
FIG. 9 is a view for use in describing a field effect transistor according to a fifth embodiment of this invention.

Referring to FIG. 9 together with FIG. 6, a field effect transistor according to a fifth embodiment of this invention is similar in structure to that illustrated in FIG. 6 except that the In compositions x1, x2, and x3 are set to 0.53, 0.7, and 0.9, respectively, as shown in FIG. 9. More specifically, the first, the second, and the third intermediate films 23b1, 23b2, and 23b3 according to the fifth embodiment are specified by $In_{0.53}Ga_{0.47}As$, $In_{0.7}Ga_{0.3}As$, and $In_{0.9}Ga_{0.1}As$, as illustrated in FIG. 9. The field effect transistor has a quantum well formed all over the channel layer 23 and an electron distribution which has a distribution center at a portion adjacent to the third intermediate film 23b3.

The electron distribution is preferable when an operation bias voltage is determined in consideration of a comparatively large drain current. Like in the before-mentioned embodiments, a high speed operation can be accomplished with this field effect transistor because the channel layer has a high In density.

The In compositions x1, x2, and x3 may be changed to any other values on the conditions that x3 is greater than x1 and x2 and that no misfit dislocation takes place.

In this event, the In compositions x1 and x2 may be smaller than 0.53 and greater than 0.4 while the In composition x3 may be equal to unity. This structure enables an increase of a critical thickness of the channel layer 23.

Moreover, the gate electrode 30 may not be restricted to Ti/Pt/Au but may be formed by any other materials which can form a Schottky junction. The thicknesses of the above-mentioned layers and films may not be restricted to the above-exemplified ones but may be changed to any other thicknesses.

In the carrier supply layer 25, an impurity is assumed to be uniformly doped in the above-mentioned examples. The impurity may be changed stepwise in a thickness direction of the carrier supply layer 25 or may be locally doped within the carrier supply layer 25.

At any rate, it is to be noted that the InP layers are used as the first and the second channel layers in each of the aforementioned field effect transistors. This means that the high drift velocity can be accomplished under a high electric field, such as $10^4$ V/cm and reaches to the extent of $5\times10^7$ cm/sec.

Figure 10:
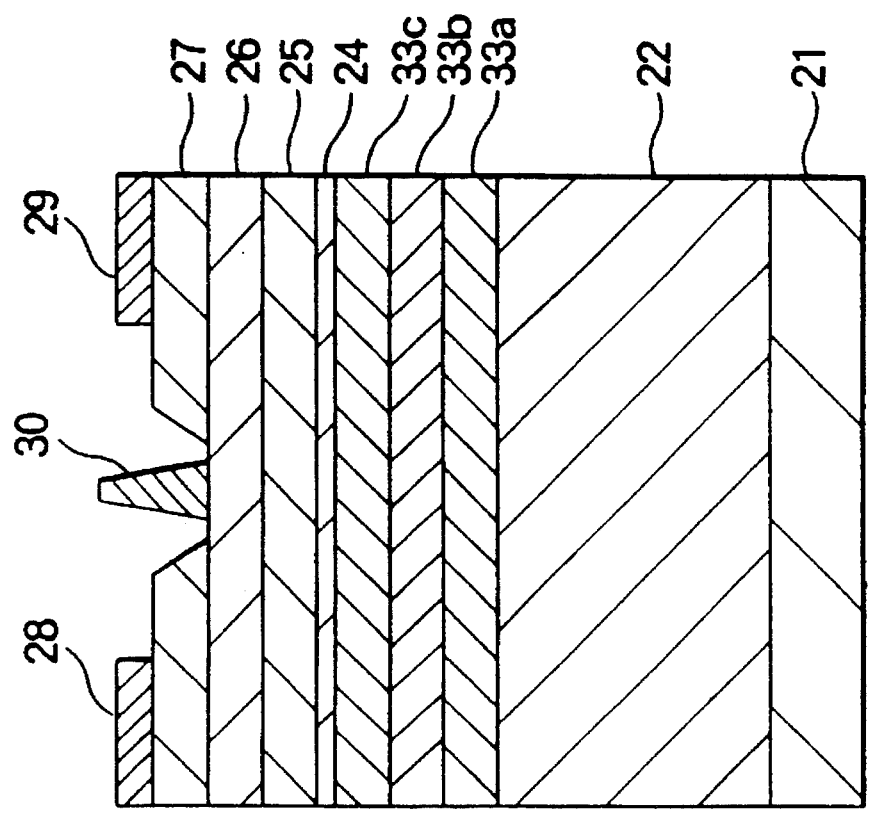
FIG. 10 is a sectional view of a field effect transistor according to a sixth embodiment of this invention.

Referring to FIG. 10, a field effect transistor according to a sixth embodiment of this invention is similar in structure to that illustrated in FIG. 1 except that a channel layer is different from the above-mentioned embodiments, as will be described in detail and will be depicted at 33 in order to distinguish between the above-mentioned embodiments and the following embodiments.

Like in FIG. 1, the illustrated field effect transistor comprises the substrate 21 of intrinsic InP, the buffer layer 22 of intrinsic $In_{0.52}Ga_{0.48}As$ deposited to a thickness of 800 nm on the substrate 21, the channel layer 33 deposited on the buffer layer 22 in a manner to be described later, the spacer layer 24 of intrinsic $In_{0.52}Ga_{0.48}As$ deposited on the channel layer 33 to a thickness of 3 nm, the carrier supply layer 25 of $In_{0.52}Ga_{0.48}As$ which is doped with an n-type impurity of, for example, silicon in a density of $2\times10^{18}$ cm$^{-3}$ and which is deposited to a thickness of 30 nm, the Schottky layer of intrinsic $In_{0.52}Ga_{0.48}As$ deposited to a thickness of 20 nm, and the cap layer 27 of $In_{0.53}Ga_{0.47}As$ doped with an n-type impurity of, for example, silicon in a density of $5\times10^{18}$ cm$^{-3}$. The buffer layer 22, the channel layer 33, the spacer layer 24, the carrier supply layer 25, the Schottky layer 26, and the cap layer 27 are deposited by the use of the metal organic chemical vapor deposition technique in conjuction with the above-mentioned embodiments.

In addition, the source and the drain electrodes 28 and 29 are formed on the cap layer 27 by evaporation of AuGe and Ni and by the following alloying process which may be a heat treatment. The source and the drain electrodes 28 and 29 are given in the form of ohmic electrodes. The gate electrode 30 of Ti, Pt, and Au is formed as a Schottky electrode in a recessed portion of the cap layer 26 between the source and the drain electrodes 28 and 29.

Figure 11:
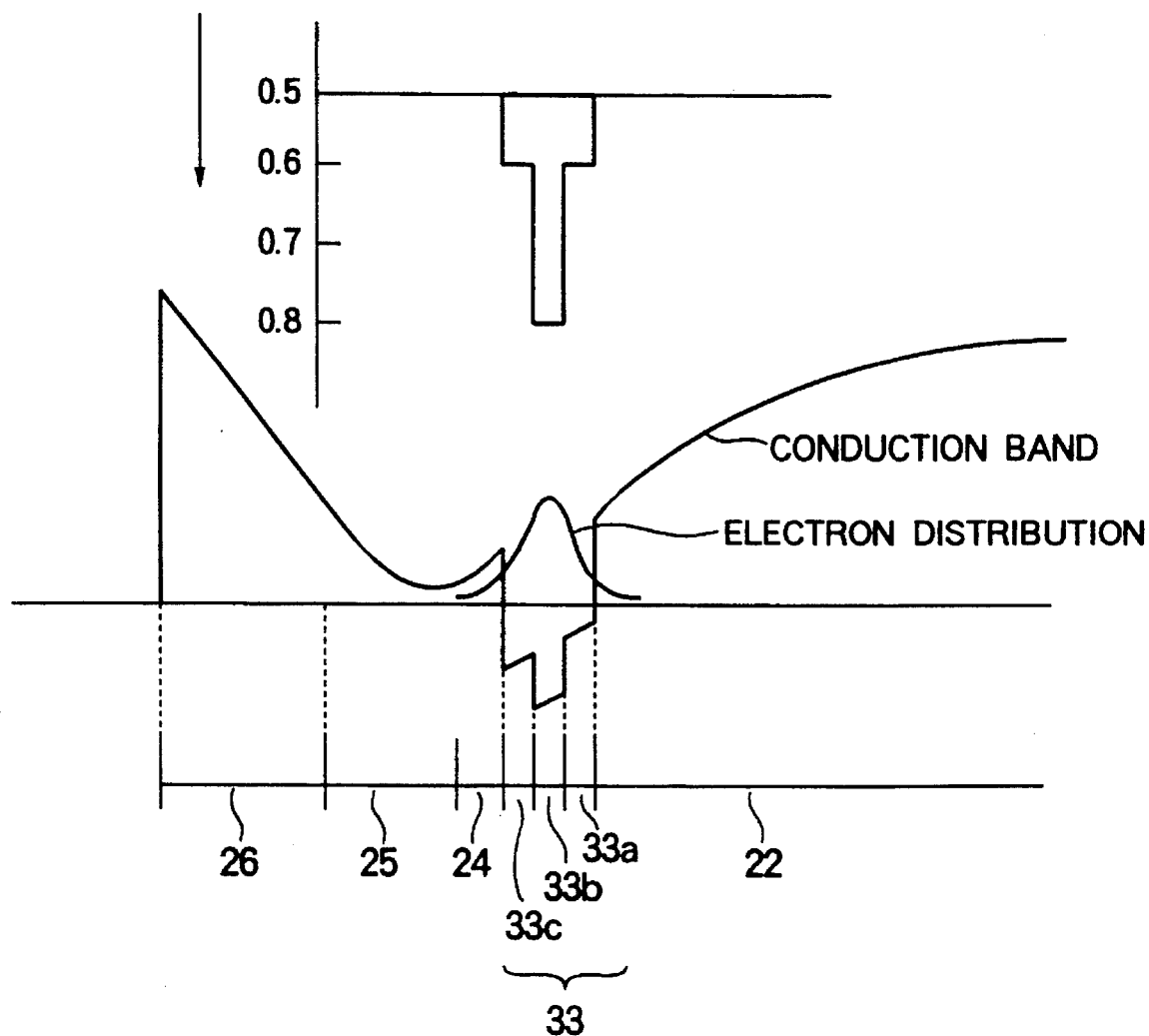
FIG. 11 is a view for use in describing a relationship among an In composition, an electron distribution, and a conduction band in the field effect transistor illustrated in FIG. 10.

Referring to FIG. 11 along with FIG. 10 again, the illustrated channel layer 33 is different from the channel layer 23 described in conjunction with the aforementioned embodiments in that the former comprises no InP layer and is formed by a multi-layer structure of InGaAs. More specifically, the channel layer 33 comprises a first channel layer 33a of $In_{x1}Ga_{1-x1}As$ deposited to a thickness of 5 nm on the buffer layer 22, an intermediate layer 33b of $In_{x3}Ga_{1-x3}As$ deposited on the first channel layer 33a, and a second channel layer 33c of $In_{x2}Ga_{1-x2}As$ deposited on the intermediate layer 33b to a thickness of 5 nm. Thus, the intermediate layer 33b is composed of a single layer which has a composition specified by $In_{x3}Ga_{1-x3}As$ and has the thickness of 5 nm.

In the illustrated example, the In compositions x1, x2, and x3 are selected at 0.6, 0.6, and 0.8, as readily understood from FIG. 11. In this connection, each of the first and the second channel layers 33a and 33c has a composition specified by $In_{0.6}Ga_{0.4}As$ while the intermediate layer 33b has a composition specified by $In_{0.8}Ga_{0.2}As$.

As shown in FIG. 11, a quantum well is formed across a whole of the channel layer 33 and a channel is provided in the quantum well mainly by a two-dimensional electron gas which may be defined by an electron distribution as illustrated in FIG. 11. Specifically, the electron distribution has a distribution center in the intermediate layer 33b and becomes smaller as it is near to the boundary faces between the first channel layer 33a and the buffer layer 22 and between the second channel layer 33c and the spacer layer 24.

As mentioned before, the intermediate layer 33b has the In composition of 0.8 greater than the In compositions of the first and the second channel layers 33a and 33c. With this structure, most of the electrons flow or run through the intermediate layer 33b at a high drift velocity. Accordingly, a high speed operation can be accomplished due to a high In density of the channel layer 33 by the use of the field effect transistor illustrated in FIG. 10 even when an electric field is as low as $5 \times 10^3$ V/cm.

In the intermediate layer 33b, the In composition may not be restricted to 0.8 but may be changed on the conditions that no misfit dislocation takes place and the In composition is not greater than 0.9. In this event, the intermediate layer 33b should be left in the form of a strained layer.

Likewise, each of the first and the second channel layers 33a and 33c may have an In composition of 0.53 at which the first channel layer 33a is lattice matched with the substrate 21 of InP. Furthermore, the In compositions in the first and the second channel layers 33a and 33c may be smaller than 0.53, if they are greater than 0.4. This structure serves to increase a critical channel layer and to thicken a whole of the channel layer because a distortion is alleviated in the channel layer 33.

Incidentally, the In composition in the first channel layer 33a may be different from that in the second channel layer 33c on the condition that each In composition in the first and the second channel layers 33a and 33c does not exceed that in the intermediate layer 33b.

Figure 12:
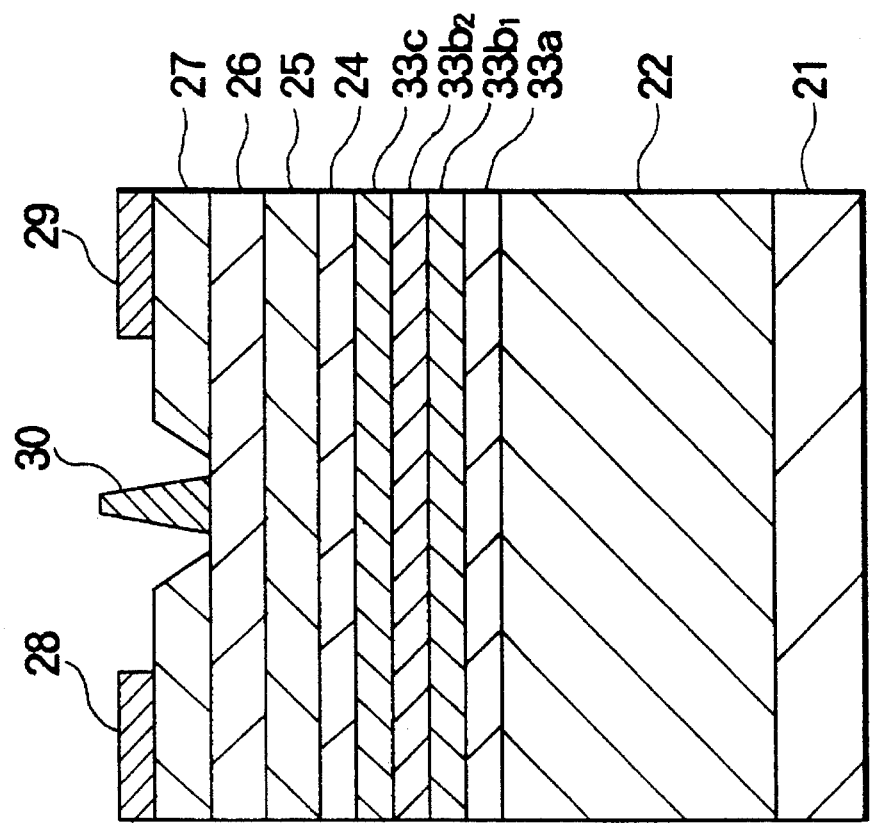
FIG. 12 is a sectional view of a field effect transistor according to a seventh embodiment of this invention.

Referring to FIG. 12, a field effect transistor according to a seventh embodiment of this invention is similar to that illustrated in FIGS. 10 and 11 except that the channel layer 33 is formed by four layers of InGaAs as will be mentioned hereinunder. More particularly, the illustrated channel layer 33 comprises the first channel layer 33a of $In_{x1}Ga_{1-x1}As$ deposited to a thickness of 3 nm on the buffer layer 22 and the second channel layer 33c of $In_{x2}Ga_{1-x2}As$ brought into contact with the spacer layer 24 and deposited to 3 nm, like in FIG. 10. Between the first and the second channel layers 33a and 33c are interposed an intermediate layer 33b which is composed of a first intermediate film 33b1 of $In_{x3}Ga_{1-x3}As$ and a second intermediate film 33b2 of $In_{x4}Ga_{1-x4}As$. The first intermediate film 33b1 is deposited on the first channel layer 33a to a thickness of 5 nm while the second intermediate film 33b2 is deposited on the first intermediate film 33b1 to a thickness of 4 nm.

Figure 13:
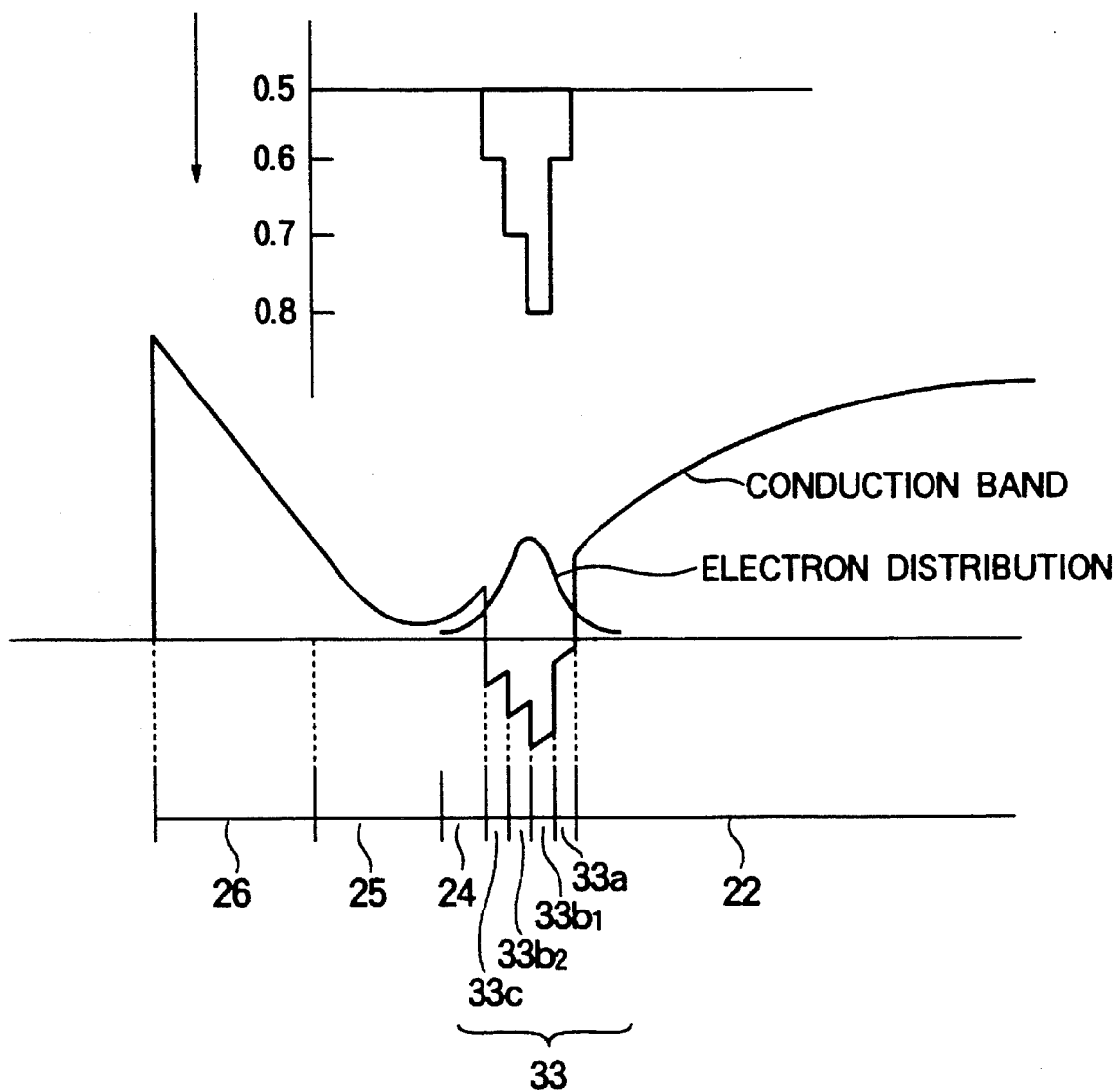
FIG. 13 is a view for use in describing a relationship among an In composition, an electron distribution, and a conduction band.

Referring to FIG. 13 together with FIG. 12, it is readily understood that x1, x2, x3, and x4 are selected at 0.6, 0.6, 0.8, and 0.7, respectively. Therefore, compositions of the first and the second channel layers 33a and 33c and the first and the second intermediate layers 33b1 and 33b2 may be given by $In_{0.6}Ga_{0.4}As$, $In_{0.6}Ga_{0.4}As$, $In_{0.8}Ga_{0.2}As$, and $In_{0.7}Ga_{0.3}As$, respectively.

With this structure also, a two-dimensional electron gas is developed within a quantum well formed by the first and the second channel layers 33a and 33c and the first and the second intermediate films 33b1 and 33b2 and is operable as a channel like in the aforementioned embodiments. As shown in FIG. 13, the quantum well is the deepest in the first intermediate film 33b1 and provides an electron distribution which has a center of the electron distribution in the first intermediate film 33b1.

As mentioned before, the first intermediate film 33b1 has the greatest In composition of 0.8 while the second intermediate film 33b2 has the In composition of 0.7 greater than those of the first and the second channel layers 33a and 33c. Therefore, the center of the electron distribution in the channel is moved towards the substrate 21. This electron distribution is very effective when the operation bias voltage is set at a region adjacent to a pinch-off voltage.

In addition, a high speed operation can be achieved in the illustrated example because the electrons mainly flow through the first intermediate film 33a which has a high In density. Thus, a device characteristic is improved in the field effect transistor also.

It is to be noted that the In compositions in the first and the second channel layers 33a and 33c and the first and the second intermediate films 33b1 and 33b2 may not be restricted to 0.6, 0.6, 0.8, and 0.7, respectively, but may be modified within a range in which no misfit dislocation occurs, as long as relationships among x1, x2, x3, and x4 satisfy the conditions of x3>x1 and x3>x4>x2 and the channel layer 33 is left in the form of a strained layer.

Under the above-mentioned conditions, the In compositions in the first and the second channel layers 33a and 33c may be selected at 0.53 so as to lattice match the first and the second channel layers 33a and 33c with the substrate 21 of InP. Moreover, the In compositions in the first and the second channel layers 33a and 33c may be smaller than 0.53, if they are greater than 0.4. This structure brings about an increase of a channel critical thickness and an increase of a total channel thickness.

Figure 14:
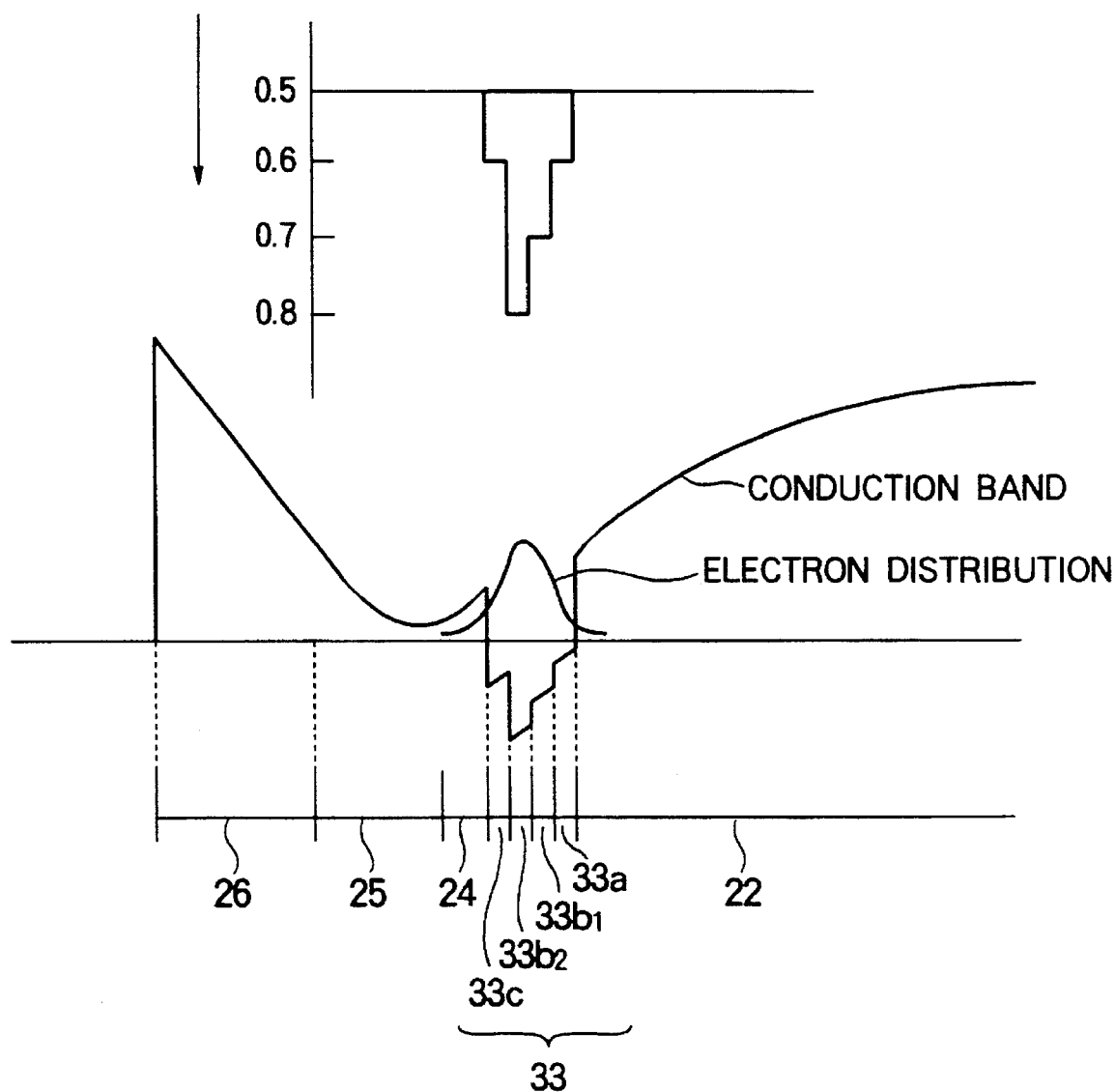
FIG. 14 is a similar view for use in describing a field effect transistor according to an eighth embodiment of this invention.

Referring to FIG. 14 afresh and FIG. 12, a field effect transistor according to an eighth embodiment of this invention is similar in structure to that illustrated in FIG. 12 except that the In compositions x3 and x4 in the first and the second intermediate films 33b1 and 33b2 are set to 0.7 and 0.8 with the In compositions kept at 0.6 in the first and the second channel layers 33a and 33c, as illustrated in FIG. 13.

In the example being illustrated, each of the first and the second channel layers 33a and 33c has a thickness of 3 nm while the first and the second intermediate films 33b1 and 33b2 have thicknesses of 4 nm and 5 nm, respectively.

With this structure also, a two-dimensional electron gas is developed within a quantum well formed across a whole of the channel layer 33 and is operable as a channel. Specifically, the In composition x4 in the second intermediate film 33b2 is selected at 0.8 and is higher than the In composition x3 in the first intermediate film 33b1. In addition, the first intermediate film 33b1 has the In composition higher than that of each of the first and the second channel layers 33a and 33c. In this connection, an electron distribution has a distribution center or peak in the second intermediate film 33b2. This shows that the distribution center is shifted towards the device surface, namely, the source, the drain, and the gate electrodes 28, 29, and 30.

The illustrated field effect transistor is effective when the operation bias voltage is set so that a large current is caused to flow through the field effect transistor. The electrons are mainly moved at a high drift velocity due to an In density distribution, which enables an improvement of a device characteristic.

Although x1 and x2 are also set to 0.6 in the above-mentioned example, they may be selected at 0.53 so as to lattice match the first channel layer 33a with the substrate 21 of InP. In addition, the In compositions x1 and x2 may be smaller than 0.53, if they are greater than 0.4. In this event, a channel critical thickness and a whole channel thickness can be increased, as already mentioned in conjunction with the aforementioned embodiments.

On the other hand, the In composition x4 may be greater than 0.8, if it is smaller than 0.9.

At any rate, the In compositions x1, x2, x3, and x4 in the first and the second channel layers 33a and 33c and the first and the second intermediate films 33b1 and 33b2 may not be restricted to 0.6, 0.6, 0.7, and 0.8 but may be modified within a range in which no misfit dislocation occurs with a strained layer left, when relationships among x1, x2, x3, and x4 satisfy the conditions of x4>x3>x1 and x4>x3.

Figure 15:
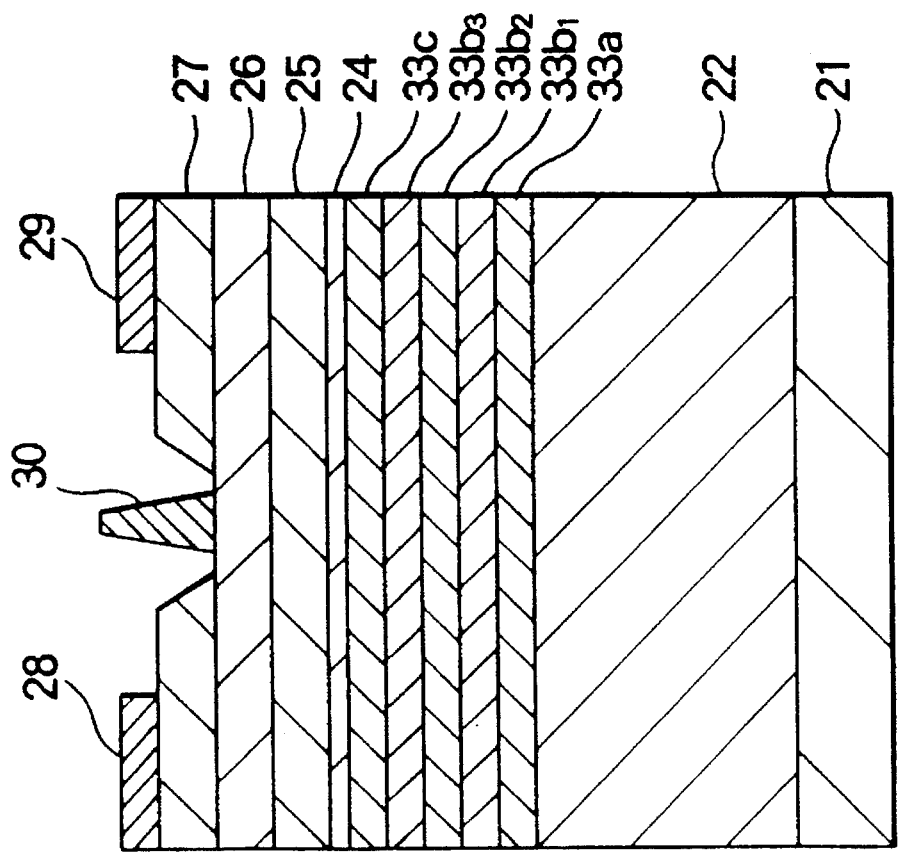
FIG. 15 is a sectional view of a field effect transistor according to a ninth embodiment of this invention.

Referring to FIG. 15, a field effect transistor according to a ninth embodiment of this invention is similar to that illustrated in FIG. 12 except that a channel layer 33 comprises, as the intermediate layer 33b, first, second, and third intermediate films 33b1, 33b2, and 3363 between the first and the second channel layers 33a and 33c. The first and the second channel layers 33a and 33c have compositions represented by $In_{x1}Ga_{1-x1}As$ and $In_{x2}Ga_{1-x2}As$, respectively, while the first through the third intermediate layers 33b1 to 33b3 have compositions represented by $In_{x3}Ga_{1-x3}As$, $In_{x4}Ga_{1-x4}As$ and $In_{x5}Ga_{1-x5}As$ respectively.

In the illustrated example, each of the first and the second channel layers 33a and 33c is deposited to a thickness of 3 nm while each of the first through the third intermediate layers 33b1 to 33b3 is deposited to a thickness of 3 nm.

Figure 16:
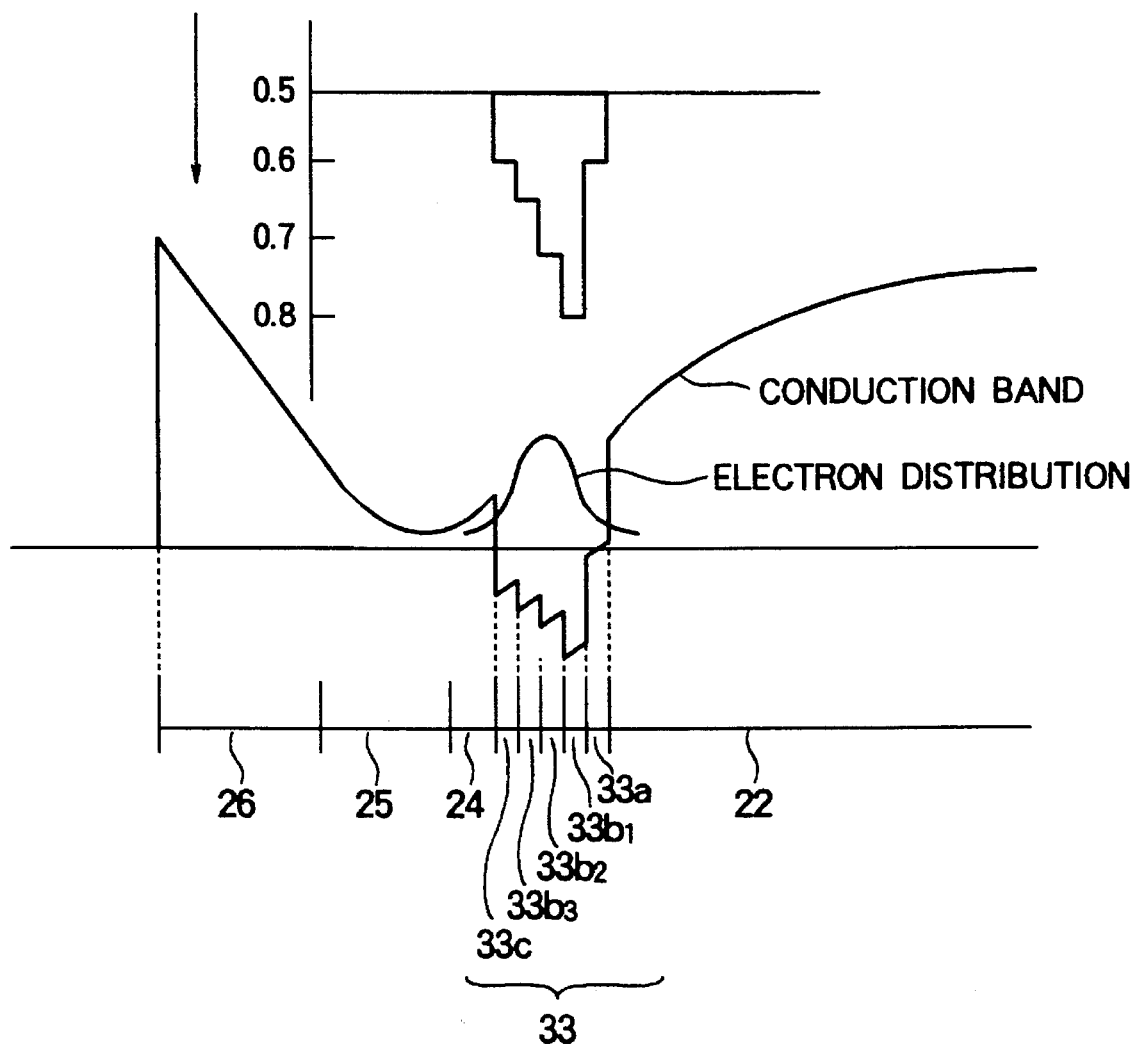
FIG. 16 is a view for use in describing a relationship among an In composition of a channel layer illustrated in FIG. 15, an electron distribution, and a conduction band.

Referring to FIG. 16 in addition to FIG. 15, the In compositions x1, x2, x3, x4, and x5 in the first and the second channel layers 33a and 33c and the first through the third intermediate films 33b1 to 33b3 are illustrated in relation to an electron distribution and a conduction band like in the other figures. Specifically, the In compositions x1, x2, x3, x4, and x5 are selected at 0.6, 0.6, 0.8, 0.72, and 0.65, respectively. Accordingly, each of the first and the second channel layers 33a and 33c has a composition represented by $In_{0.6}Ga_{0.4}As$ while the first through the third intermediate films 33b1 to 33b3 have compositions represented by $In_{0.8}Ga_{0.2}As$, $In_{0.72}Ga_{0.28}As$, and $In_{0.65}Ga_{0.35}As$, respectively.

In FIG. 16, a two-dimensional electron gas is developed in a quantum well formed across a whole of the channel layer 33 and has an electron distribution as shown in FIG. 16. Like in the other embodiments, the two-dimensional electron gas is operable as a channel. In addition, the first intermediate film 33b1 has the In composition of 0.8 which is the highest in the channel layer 33 while the second and the third intermediate films 33b2 and 33b3 have the In compositions of 0.72 and 0.65 both of which are higher than the In composition of 0.6 in the first and the second channel layers 33a and 33c.

When the quantum well is structured in the above-mentioned manner, the distribution center of the electrons in the channel is shifted towards the substrate 21 of InP. Such an electron distribution is effective when the field effect transistor is operated in a region adjacent to a pinch-off voltage. With this structure also, a high speed operation can be accomplished in dependence upon the In density distribution, which brings about an improvement of the field effect transistor.

In the ninth embodiment also, the In compositions x1 to x5 may be modified if the channel layer is left in the form of a strained layer without misfit dislocation and relationships among x1 to x5 satisfy the conditions of x3>x1 and x3>x4>x5>x2.

As mentioned in conjunction with the above-mentioned embodiments, the In composition in each of the first and the second channel layers 33a and 33c may be selected at 0.53 or may be selected at a value smaller than 0.53. This enables an increase of a critical channel thickness and an increase of a total channel thickness, as already described before.

Figure 17:
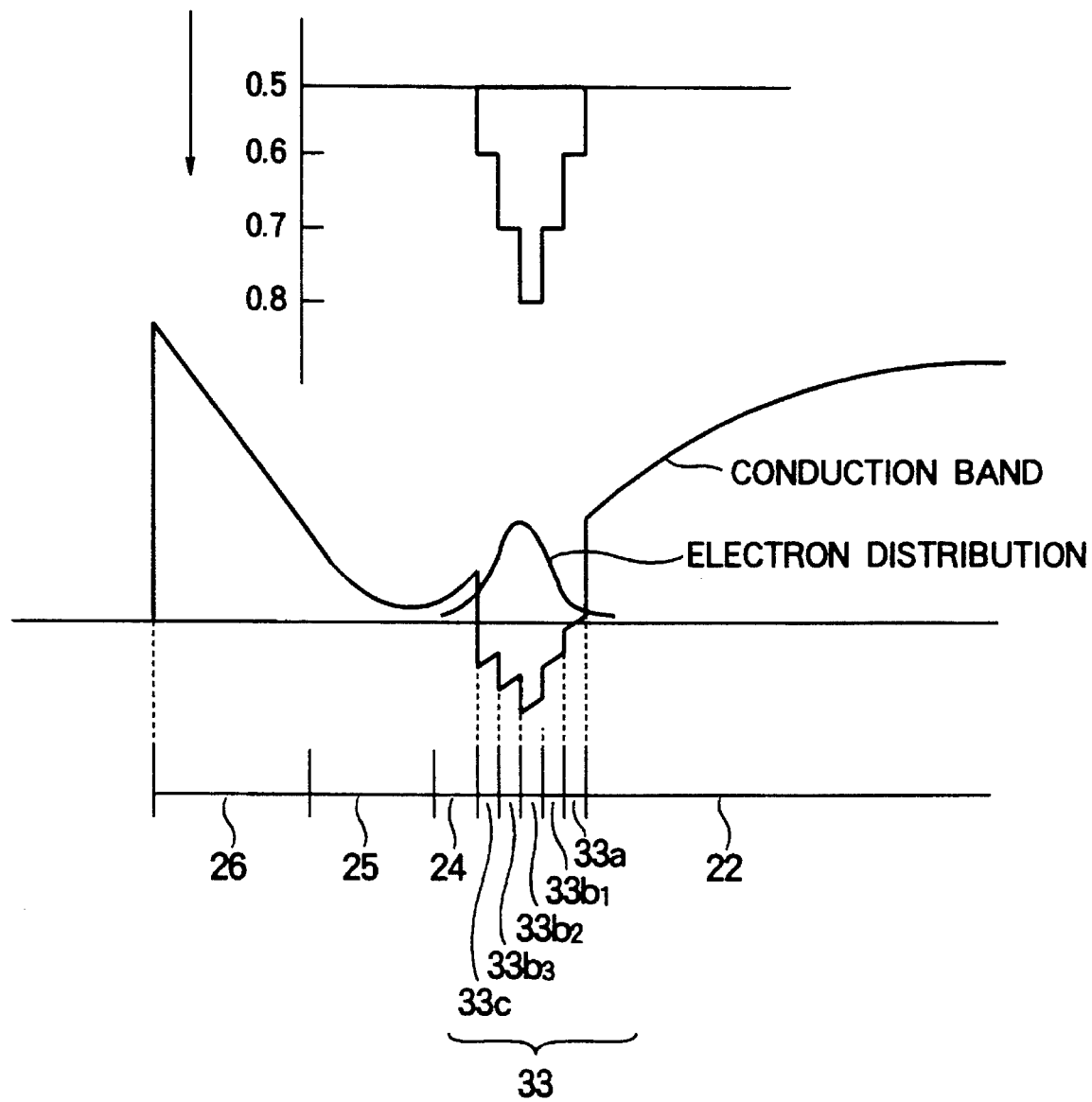
FIG. 17 is a similar view for use in describing a field effect transistor according to a tenth embodiment of this invention.

Referring to FIG. 17 anew and FIG. 15 again, a field effect transistor according to a tenth embodiment of this invention is similar to that illustrated in FIG. 15 except that the In compositions x3, x4, and x5 in the first through the third intermediate films 33b1 to 33b3 are selected at 0.7, 0.8, and 0.7, respectively. Each of the first through the third intermediate films 33b1 to 33b3 is deposited to a thickness of 3 nm while each of the first and the second channel layers 33a and 33c is also deposited to a thickness of 3 nm. Like in FIG. 16, a two-dimensional electron gas is developed within a quantum well formed across a whole of the channel layer 33 and is operable as a channel. With this structure, an electron distribution in the channel layer 33 has a distribution center or peak at the second intermediate film 33b2, as illustrated in FIG. 17. This is because the In composition is the highest in the second intermediate film 33b2.

On the other hand, each of the first and the third intermediate films 33b1 and 33b3 has the In composition of 0.7 which exceeds the In composition of 0.6 of each of the first and the second channel layers 33a and 33c.

As a result, the distribution center of the electron distribution is located at a center or the second intermediate film 33b2, which is effective to conveniently operate the field effect transistor. Inasmuch as an operation speed depends on the In composition or density in the channel layer, the illustrated field effect transistor can carry out operation at a high speed like in the other embodiments.

In the illustrated example, the In compositions in the first and the second channel layers 33a and 33c and the first through the third intermediate films 33b1 to 33b3 may be changed to any other values on the conditions that the In composition x4 becomes maximum and is greater than the In compositions x3 and x5 both of which are selected at 0.7 and which are greater than x1 and x2, if no misfit dislocation occurs in the channel layer 33 like in the other embodiments.

In the illustrated example also, the In compositions x1 and x2 may be selected at 0.53 so as to lattice match the channel layer 33 with InP or may be smaller than 0.53, if they are greater than 0.4. In any event, this structure is effective to increase a channel critical thickness and a total channel thickness.

Figure 18:
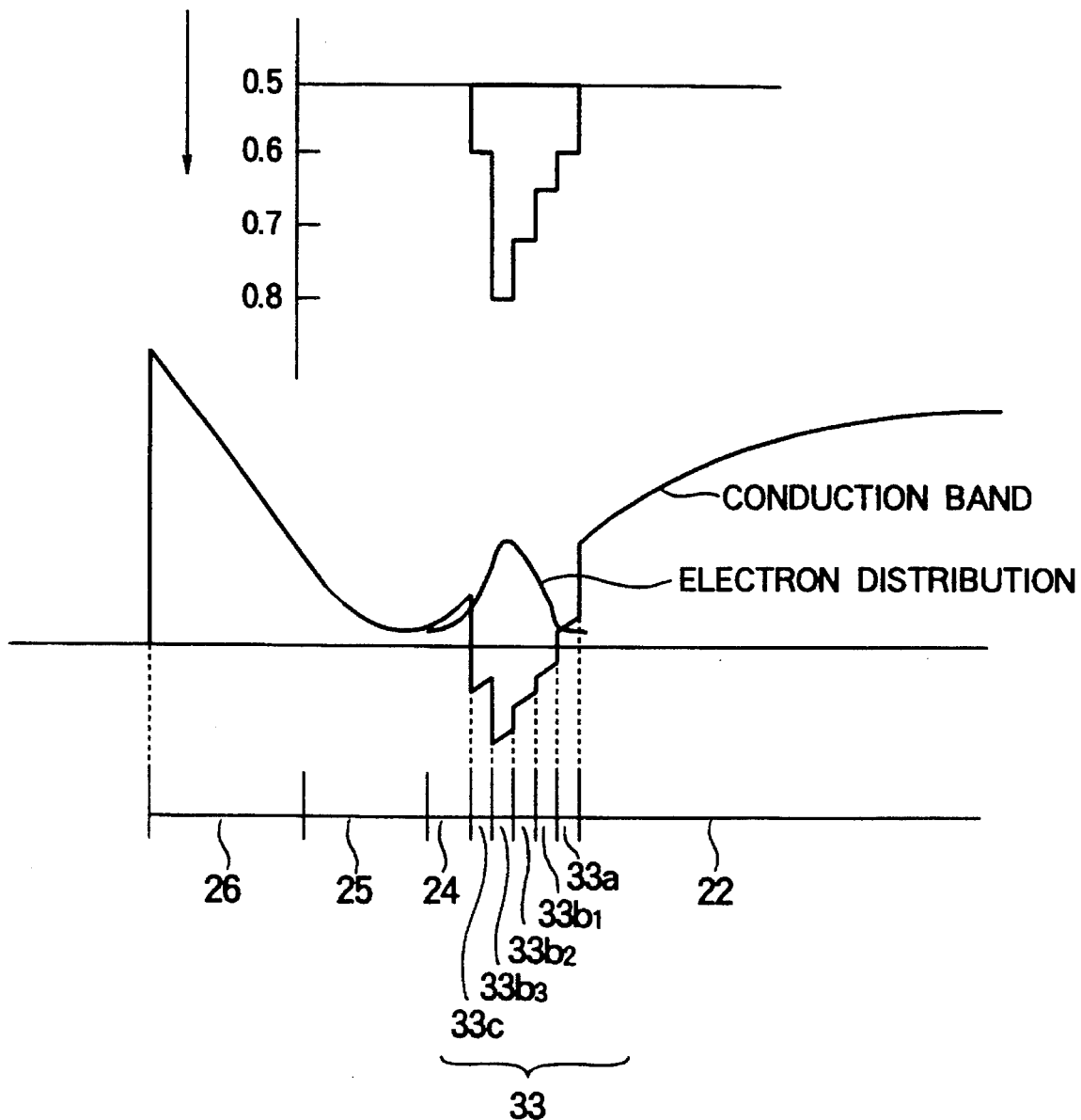
FIG. 18 is a similar view for use in describing a field effect transistor according to an eleventh embodiment of this invention.

Referring to FIG. 18 together with FIG. 15, a field effect transistor according to an eleventh embodiment of this invention is similar to that illustrated in FIG. 15 except that the In compositions x3, x4, and x5 in the first through the third intermediate films 33b1 to 33b3 are selected at 0.65, 0.72, and 0.8 with the In compositions x1 and x2 in the first and the second channel layers 33a and 33c kept at 0.6. Herein, it is assumed that each of the first and the second channel layers 33a and 33c and the first through the third intermediate films 33b1 to 33b3 is 3 nm thick.

Thus, the In composition x5 in the third intermediate film 33b3 is selected at a maximum value in the illustrated example. With this structure, a two-dimensional electron gas is developed within a quantum well formed across the first and the second channel layers 33a and 33c and the first through the third intermediate films 33b1 to 33b3, as illustrated in FIG. 18.

More particularly, the first intermediate film 33b1 has the In composition of 0.65 higher than the In composition of 0.6 of the first channel layer 33a while the second intermediate film 33b2 has the In composition of 0.72 higher than the In composition of 0.65 in the first intermediate film 33b1. In addition, the In composition x5 of the third intermediate film 33b3 is selected at 0.8 and higher than the In composition of 0.6 in the second channel layer 33c and the In composition of 0.72 in the second intermediate film 33b2.

With this structure, an electron distribution in the channel is determined by the quantum well and has a center shifted towards the device surface, namely, the electrodes, such as 28, 29, and 30. From this fact, it is readily understood that a high speed operation can be accomplished because it depends on the In composition or density in the channel layer 33.

The In compositions x1 and x2 in the first and the second channel layers 33a and 33c may be selected at 0.53 to be lattice matched with the substrate 21 of InP or may be smaller than 0.53, if it is greater than 0.4. This enables an increase of a channel critical thickness and a total channel thickness.

At any rate, when the channel layer 33 is implemented by a plurality of InGaAs layers, it is possible to achieve a high drift velocity, such as $5 \times 10^7$ cm/sec under a comparatively low electric field, such as $5 \times 10^3$ V/cm.

In the embodiments illustrated in conjunction with FIGS. 10 through 18, the gate electrode 30 which provides a Schottky junction may be formed by any other material than Ti/Pt/Au. Although it is assumed in the above-mentioned embodiments that the carrier supply layer 25 is uniformly doped with an impurity of an n-type, a distribution of such an impurity may be varied in a depth direction within the carrier supply layer 25 or may be locally dense.

While this invention has thus far been described in conjunction with several embodiments thereof, it will readily be possible for those skilled in the art to put this invention into practice in various other manners. For example, more than three intermediate films may be interposed as the intermediate layer between the first and the second channel layers. In this event, the In compositions may be determined at every one of the intermediate films in consideration of a device characteristic in question. In addition, the substrate 21 may not be always restricted to InP. The field effect transistor illustrated in FIGS. 1 through 18 covers a HEMT (high electron mobility transistor) or the like. Deposition of each layer or film may be made by the use of MBE.

What is claimed is:

1. A field effect transistor, comprising:
  a semi-insulator substrate of InP;
  a buffer layer on said semi-insulator substrate;
  a non-doped channel layer on said buffer layer; and
  a carrier supply layer which is doped with an n-type impurity and which is deposited on Said non-doped channel layer;.
  said non-doped channel layer comprising:
    a first layer of non-doped InP on said buffer layer;
    an intermediate layer of non-doped InGaAs on said first layer; and
    a second layer of non-doped InP on said intermediate layer;
  wherein said intermediate layer is composed of:
    a first intermediate film which is deposited on said first layer and which consists of a composition represented by $In_{x1}Ga_{1-x1}As$; and
    a second intermediate film which is deposited on said first intermediate film and which consists of a composition represented by $In_{x2}Ga_{1-x2}As$, where x1 is greater than 0.4 and smaller than x2 and where x1 is not greater than unity.

2. A field effect transistor, comprising:
  a semi-insulator substrate of InP;
  a buffer layer on said semi-insulator substrate;
  a non-doped channel layer on said buffer layer; and
  a carrier supply layer which is doped with an n-type impurity and which is deposited on said non-doped channel layer.
  said non-doped channel layer comprising:
    a first layer of non-doped InP on said buffer layer;
    an intermediate layer of non-doped InGaAs on said first layer; and
    a second layer of non-doped InP on said intermediate layer;
  wherein said intermediate layer comprises:
    a first intermediate film which is deposited on said first layer and which consists of a composition represented by $In_{x1}Ga_{1-x1}As$;
    a second intermediate film which is deposited on said first intermediate film and which consists of a composition represented by $In_{x2}Ga_{1-x2}As$; and
    a third intermediate film which is deposited on said second intermediate film and which consists of a composition represented by $In_{x3}Ga_{1-x3}As$, where x2 is greater than 0.4 and smaller than x1, where x1 is not greater than unity, and where x3 is greater than 0.4 and smaller than x1.

3. A field effect transistor, comprising:
  a semi-insulator substrate of InP;
  a buffer layer on said semi-insulator substrate;
  a non-doped channel layer on said buffer layer; and
  a carrier supply layer which is doped with an n-type impurity and which is deposited on said non-doped channel layer;
  said non-doped channel layer comprising:
    a first layer of non-doped InP on said buffer layer;
    an intermediate layer of non-doped InGaAs on said first layer; and
    a second layer of non-doped InP on said intermediate layer;
  wherein said intermediate layer comprises:
    a first intermediate film which is deposited on said first layer and which consists of a composition represented by $In_{x1}Ga_{1-x1}As$;
    a second intermediate film which is deposited on said first intermediate film and which consists of a composition represented by $In_{x2}Ga_{1-x2}As$; and
    a third intermediate film which is deposited on said second intermediate film and which consists of a composition represented by $In_{x3}Ga_{1-x3}As$, where x1 is greater than 0.4 and smaller than x2, where x2 is not greater than unity, and where x3 is greater than 0.4 and smaller than x2.

4. A field effect transistor, comprising:
  a semi-insulator substrate of InP;
  a buffer layer on said semi-insulator substrate;
  a non-doped channel layer on said buffer layer; and
  a carrier supply layer which is doped with an n-type impurity and which is deposited on said non-doped channel layer;

said non-doped channel layer comprising:
- a first layer of non-doped InP on said buffer layer;
- an intermediate layer of non-doped InGaAs on said first layer; and
- a second layer of non-doped InP on said intermediate layer;

wherein said intermediate layer comprises:
- a first intermediate film which is deposited on said first layer and which consists of a composition represented by $In_{x1}Ga_{1-x1}As$;
- a second intermediate film which is deposited on said first intermediate film and which consists of a composition represented by $In_{x2}Ga_{1-x2}As$; and
- a third intermediate film which is deposited on said second intermediate film and which consists of a composition represented by $In_{x3}Ga_{1-x3}As$, where x1 is greater than 0.4 and smaller than x3, where x3 is not greater than unity, and where x2 is greater than 0.4 and smaller than x3.

5. A field effect transistor, comprising:
- a semi-insulator substrate of InP;
- a buffer layer which is deposited on said semi-insulator substrate and which includes In;
- a non-doped channel layer on said buffer layer; and
- a carrier supply layer which is doped with an n-type impurity and which is deposited on said non-doped channel layer;

said non-doped channel layer comprising:
- a first layer which is deposited on said buffer layer and which consists of a non-doped composition represented by $In_{x1}Ga_{1-x1}As$;
- an intermediate layer of non-doped InGaAs which is deposited on said first layer and which has a non-doped composition different from said first layer and represented by $In_xGa_{1-x}As$ where x is greater than 0.4; and
- a second layer which is deposited on said intermediate layer and which consists of a non-doped composition represented by $In_{x2}G_{1-x2}As$ and different from said intermediate layer, where x1 and x2 are smaller than x, and wherein said intermediate layer of $In_xGa_{1-x}As$ is composed of a single layer which consists of a non-doped composition represented by $In_{x3}Ga_{1-x3}As$, where x1 is greater than 0.4 and smaller than x3, where x3 is smaller than 0.9, and where x2 is greater than 0.4 and smaller than x3.

6. A field effect transistor as claimed in claim 5, wherein said intermediate layer of $In_xGa_{1-x}As$ is composed of:
- a first intermediate film which is deposited on said first layer and which consists of a non-doped composition represented by $In_{x3}Ga_{1-x3}As$; and
- a second intermediate film which is deposited on said first intermediate film and which consists of a non-doped composition represented by $In_{x4}Ga_{1-4x}As$, where x3 is different from x4.

7. A field effect transistor as claimed in claim 6, wherein x1 is greater than 0.4 and smaller than x3; x3 is smaller than 0.9; x2 is greater than 0.4 and smaller than x4; and x4 is smaller than x3.

8. A field effect transistor as claimed in claim 6, wherein x1 is greater than 0.4 and smaller than x3; x3 is smaller than x4; x4 is smaller than 0.9; x2 is greater than 0.4 and smaller than x4.

9. A field effect transistor, comprising:
- a semi-insulator substrate of InP;
- a buffer layer which is deposited on said semi-insulator substrate and which includes In;
- a non-doped channel layer on said buffer layer; and
- a carrier supply layer which is doped with an n-type impurity and which is deposited on said non-doped channel layer;

said non-doped channel layer comprising:
- a first layer which is deposited on said buffer layer and which consists of a non-doped composition represented by $In_{x1}Ga_{1-x1}As$;
- an intermediate layer of non-doped InGaAs which is deposited on said first layer and which has a non-doped composition different from said first layer and represented by $In_xGa_{1-x}As$ where x is greater than 0.4; and
- a second layer which is deposited on said intermediate layer and which consists of a non-doped composition represented by $In_{x2}G_{1-x2}As$ and different from said intermediate layer, where x1 and x2 are smaller than x, and wherein said intermediate layer is composed of:
- a first intermediate film which is deposited on said first layer and which consists of a composition represented by $In_{x3}Ga_{1-x3}As$;
- a second intermediate film which is deposited on said first intermediate film and which consists of a composition represented by $In_{x4}Ga_{1-x4}As$; and
- a third intermediate film which is deposited on said second intermediate film and which consists of a composition represented by $In_{x5}Ga_{1-x5}As$.

10. A field effect transistor as claimed in claim 9, wherein x1 is greater than 0.4 and smaller than x3; x3 is smaller than 0.9; x2 is greater than 0.4 and smaller than x5; x5 is smaller than x4; and x4 is smaller than x3.

11. A field effect transistor as claimed in claim 9, wherein x1 is greater than x3; x4 is greater than x3 and smaller than 0.9; x2 is greater than 0.4 and smaller than x5; x5 is smaller than x4.

12. A field effect transistor as claimed in claim 9, wherein x1 is greater than 0.4 and smaller than x3; x4 is greater than x3 and smaller than x5; x2 is greater than 0.4 and smaller than x5; and x5 is smaller than 0.9.

* * * * *

UNITED STATES PATENT AND TRADEMARK OFFICE
CERTIFICATE OF CORRECTION

PATENT NO. : 5,453,631
DATED : September 26, 1995
INVENTOR(S) : Onda et al.

It is certified that error appears in the above-indentified patent and that said Letters Patent is hereby corrected as shown below:

Col. 13, line 15, delete "3363" insert --33b3--.

Signed and Sealed this

Twenty-first Day of May, 1996

Attest:

BRUCE LEHMAN

*Attesting Officer*  *Commissioner of Patents and Trademarks*